United States Patent
Togashi et al.

(10) Patent No.: US 11,968,882 B2
(45) Date of Patent: Apr. 23, 2024

(54) HIGH-MOLECULAR-WEIGHT COMPOUND INCLUDING SUBSTITUTED TRIARYLAMINE STRUCTURAL UNIT, AND ORGANIC ELECTROLUMINESCENT DEVICE

(71) Applicant: HODOGAYA CHEMICAL CO., LTD., Tokyo (JP)

(72) Inventors: Kazunori Togashi, Tokyo (JP); Mika Shinoda, Tokyo (JP); Hideyoshi Kitahara, Tokyo (JP); Shunji Mochizuki, Tokyo (JP); Hiroki Hirai, Tokyo (JP); Yuta Saegusa, Tokyo (JP)

(73) Assignee: HODOGAYA CHEMICAL CO., LTD., Tokyo (JP)

( * ) Notice: Subject to any disclaimer, the term of this patent is extended or adjusted under 35 U.S.C. 154(b) by 75 days.

(21) Appl. No.: 17/616,537

(22) PCT Filed: May 29, 2020

(86) PCT No.: PCT/JP2020/021499
§ 371 (c)(1),
(2) Date: Dec. 3, 2021

(87) PCT Pub. No.: WO2020/246404
PCT Pub. Date: Dec. 10, 2020

(65) Prior Publication Data
US 2022/0255008 A1    Aug. 11, 2022

(30) Foreign Application Priority Data
Jun. 5, 2019    (JP) .................................. 2019-105419

(51) Int. Cl.
*H10K 85/10*    (2023.01)
*C08G 61/12*    (2006.01)
*H10K 50/15*    (2023.01)

(52) U.S. Cl.
CPC ........... *H10K 85/115* (2023.02); *C08G 61/12* (2013.01); *H10K 85/151* (2023.02);
(Continued)

(58) Field of Classification Search
CPC .... H10K 85/111; H10K 85/151; H10K 50/17; H10K 50/15; C08F 212/32;
(Continued)

(56) References Cited

U.S. PATENT DOCUMENTS

2001/0026878 A1   10/2001   Woo et al.
2007/0126345 A1    6/2007   Hudack et al.
(Continued)

FOREIGN PATENT DOCUMENTS

CN    103636020 A    3/2014
EP    3 597 689 A1    1/2020
(Continued)

OTHER PUBLICATIONS

Chinese Office Action and Search Report for Chinese Application No. 202080038150.5, dated Mar. 15, 2023, with English translation of the Office Action.
(Continued)

*Primary Examiner* — Shane Fang
(74) *Attorney, Agent, or Firm* — Birch, Stewart, Kolasch & Birch, LLP

(57) ABSTRACT

A high-molecular-weight compound having at least one substituted triarylamine structural unit represented by the following general formula (1), further including a structural unit having at least one aromatic hydrocarbon ring or a structural unit having a triarylamine skeleton in addition to the at least one substituted triarylamine structural unit, and having a weight average molecular weight of 10,000 or more and 1,000,000 or less in terms of polystyrene and no a
(Continued)

crosslinker, wherein the high-molecular-weight compound is used in an organic EL device as a constituent material of at least one organic layer. A polymer material having excellent hole injection/transport performance, electron blocking capability, high heat resistance, and high stability in a thin-film state for use in a polymer organic EL device, and an organic EL device having a low drive voltage, high light emission efficiency, and a long lifetime using this polymer material.

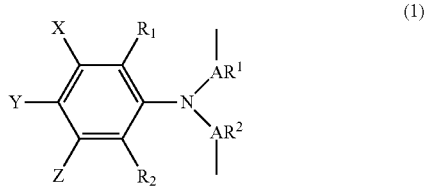

(1)

21 Claims, 22 Drawing Sheets

(52) U.S. Cl.
CPC .............. *C08G 2261/124* (2013.01); *C08G 2261/1412* (2013.01); *C08G 2261/148* (2013.01); *C08G 2261/18* (2013.01); *C08G 2261/228* (2013.01); *C08G 2261/314* (2013.01); *C08G 2261/3142* (2013.01); *C08G 2261/3162* (2013.01); *C08G 2261/95* (2013.01); *H10K 50/15* (2023.02)

(58) Field of Classification Search
CPC .... C09D 125/18; C09D 165/00; C08G 61/12; C08G 2261/12; C08G 2261/1412; C08G 2261/1424; C08G 2261/148; C08G 2261/195; C08G 2261/3162; C08G 2261/76; C08G 2261/95; C08L 79/02; H01L 51/0039; H01L 51/0043; H01L 51/5056; H01L 51/5072; H01L 51/5088; H01L 51/5092; H01L 51/56
See application file for complete search history.

(56) References Cited

U.S. PATENT DOCUMENTS

| | | | |
|---|---|---|---|
| 2009/0174311 | A1 | 7/2009 | Patel et al. |
| 2011/0095269 | A1 | 4/2011 | Zhang et al. |
| 2014/0114040 | A1 | 4/2014 | Brown et al. |
| 2015/0188069 | A1 | 7/2015 | Patel et al. |
| 2018/0066000 | A1 | 3/2018 | Stoessel et al. |
| 2019/0326515 | A1 | 10/2019 | Togashi et al. |
| 2019/0378989 | A1 | 12/2019 | Togashi et al. |

FOREIGN PATENT DOCUMENTS

| | | | |
|---|---|---|---|
| JP | 2005-272834 | A | 10/2005 |
| JP | 2007-119763 | A | 5/2007 |
| JP | 2007-162009 | A | 6/2007 |
| JP | 2007-177225 | A | 7/2007 |
| JP | 4375820 | B2 | 12/2009 |
| JP | 2011-506626 | A | 3/2011 |
| JP | 2014-519537 | A | 8/2014 |
| JP | 2018-519268 | A | 7/2018 |
| WO | WO 2005/049546 | A1 | 6/2005 |
| WO | WO 2005/059951 | A2 | 6/2005 |
| WO | WO 2009/067419 | A1 | 5/2009 |
| WO | WO 2012/180382 | A1 | 11/2012 |
| WO | WO 2018/101331 | A1 | 6/2018 |
| WO | WO 2018/168667 | A1 | 9/2018 |

OTHER PUBLICATIONS

Extended European Search Report for European Application No. 20819104.9, dated Mar. 13, 2023.
International Search Report, issued in PCT/JP2020/021499, PCT/ISA/210, dated Aug. 18, 2020.
Chinese Office Action for corresponding Chinese Application No. 202080038150.5, dated Sep. 23, 2023, with English translation.

(Structural unit 1)

(Structural unit 2)

(Structural unit 3)

(Structural unit 4)

(Structural unit 5)

(Structural unit 6)

(Structural unit 7)

(Structural unit 8)

(Structural unit 9)

(Structural unit 157)

(Structural unit 158)

(Structural unit 159)

(Structural unit 160)

(Structural unit 161)

(Structural unit 162)

(Structural unit 163)

(Structural unit 164)

(Structural unit 165)

← 7 Cathode
← 6 Electron transport layer
← 5 Light-emitting layer
← 4 Hole transport layer
← 3 Hole injection layer
← 2 Transparent anode
← 1 Glass substrate

HIGH-MOLECULAR-WEIGHT COMPOUND INCLUDING SUBSTITUTED TRIARYLAMINE STRUCTURAL UNIT, AND ORGANIC ELECTROLUMINESCENT DEVICE

TECHNICAL FIELD

The present invention relates to a high-molecular-weight compound suitable for an organic electroluminescent device (organic EL device) that is a self-light-emitting device suitable for various display devices, and to the device.

BACKGROUND ART

Since an organic EL device is a self-light-emitting device, it is brighter than a liquid crystal device, has excellent visibility, is capable of performing clear display, and thus has been actively studied.

The organic EL device has a configuration in which a thin film (organic layer) of an organic compound is sandwiched between an anode and a cathode. The methods of forming a thin film are roughly classified into a vacuum vapor deposition method and a coating method. The vacuum vapor deposition method is a method of forming a thin film on a substrate in a vacuum mainly using a low-molecular compound, and is a technology that has been put into practical use. Meanwhile, the coating method is a method of forming a thin film on a substrate mainly using a polymer compound and a solution, such as ink-jet and printing, and is a technology that is highly efficient in use of materials, suitable for large-area and high-definition, and indispensable for further large-area organic EL display.

In the vacuum vapor deposition method using a low-molecular material, the use efficiency of materials is extremely low, the deflection of the shadow mask becomes large as the size increases, and uniform deposition on a large substrate becomes difficult. Further, there is a problem that the production cost is high.

Meanwhile, in the case of the polymer material, a uniform film can be formed even on a large substrate by coating a solution of the polymer material dissolved in an organic solvent, and a coating method typified by an ink jet method and a printing method can be used using this. Therefore, it is possible to improve the use efficiency of materials and significantly reduce the production cost for preparing a device.

Although various studies have been conducted on the organic EL device using a polymer material, there has been a problem that device properties such as light emission efficiency and a lifetime are not necessarily sufficient (see, for example, Patent Literature 1 to Patent Literature 5).

In order to improve the performance of a polymer organic EL device, the most significant point is a technology of stacking an upper layer by coating without disturbing an underlying thin film. Since the polymer organic EL device is prepared by coating a solution obtained by dissolving materials in an organic solvent, there is a risk that a thin film of the lower layer elutes into the solvent of the upper layer in which the materials are dissolved, and there is a disadvantage that stacking is difficult as compared with the vacuum vapor deposition method.

There are largely two types of stacking technologies for a polymer organic EL device. One method is a method of applying a crosslinker to an underlying material. After coating the underlying material, the crosslinking proceeds by heat treatment and the obtained product is insolubilized in an organic solvent. Another method is a method of selecting the type of solvent to be used for dissolving the material of the upper layer. By selecting an organic solvent in which the underlying material is not dissolved, it is possible to prevent the underlying material from eluting when the upper layer is applied.

A fluorene polymer called TFB has been known as a typical hole transport material that has been used for a polymer organic EL device (see, Patent Literature 6 and Patent Literature 7). However, since the TFB has an insufficient hole transport property and insufficient electron blocking performance, there has been a problem that part of electrons passes through a light-emitting layer and improvement in light emission efficiency cannot be expected. Further, since the film adhesion to an adjacent layer is low, there has been a problem that an increase in the lifetime of a device cannot be expected.

Further, the present inventors have developed the hole transport material of a thermal cross-linking type having a crosslinker used for a polymer organic EL device (see Patent Literature 8 and Patent Literature 9). However, in the hole transport material of a thermal cross-linking type having a crosslinker, the crosslinking proceeds by heat treatment at a high temperature and the obtained product is insolubilized, but there has been a problem that the hole transport property is reduced.

When a method of selecting the type of solvent used for dissolving the material of the upper layer, of the above-mentioned stacking technologies for a polymer organic EL device, is used, it is unnecessary to apply a crosslinker to the underlying material.

CITATION LIST

Patent Literature

Patent Literature 1: Japanese Patent Application Laid-open No. 2005-272834
Patent Literature 2: Japanese Patent Application Laid-open No. 2007-119763
Patent Literature 3: Japanese Patent Application Laid-open No. 2007-162009
Patent Literature 4: Japanese Patent Application Laid-open No. 2007-177225
Patent Literature 5: WO 2005/049546
Patent Literature 6: Japanese Patent No. 4375820
Patent Literature 7: WO 2005/059951
Patent Literature 8: WO 2018/101331
Patent Literature 9: WO 2018/168667

DISCLOSURE OF INVENTION

Technical Problem

It is an object of the present invention to provide a polymer material that has excellent hole injection/transport performance, electron blocking capability, high heat resistance, and high stability in a thin-film state for use in a polymer organic EL device using the above-mentioned method of selecting a solvent. It is also an object of the present invention to provide a polymer organic EL device that includes an organic layer (thin film) formed of the polymer material and has a low drive voltage, high light emission efficiency, and a long lifetime.

Solution to Problem

The present inventors have synthesized and examined a high-molecular-weight compound having a substituted triarylamine structure without various crosslinkers, focusing that a substituted triarylamine structure has high hole injection/transport performance. As a result, they have found a high-molecular-weight compound having a new structure having high heat resistance and high stability in a thin-film state in addition to excellent hole injection/transport performance as compared with a high-molecular-weight compound having a crosslinker and the existing materials, and completed the present invention.

In accordance with the present invention, there is provided a high-molecular-weight compound including a substituted triarylamine structural unit represented by the following general formula (1).

(Chem. 1)

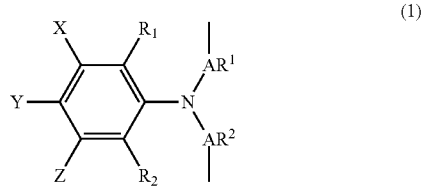

(1)

In the formula, $AR^1$ and $AR^2$ may be the same as each other and each represent a divalent aryl group or a divalent heteroaryl group, $R_1$ and $R_2$ may be the same as each other and each represent a hydrogen atom, a deuterium atom, a fluorine atom, a chlorine atom, a cyano group, a nitro group, an alkyl group having 1 to 8 carbon atoms, a cycloalkyl group having 5 to 10 carbon atoms, an alkenyl group having 2 to 6 carbon atoms, an alkyloxy group having 1 to 8 carbon atoms, or a cycloalkyloxy group having 5 to 10 carbon atoms having 5 to 10 carbon atoms, X, Y, and Z may be the same as each other and each represent a monovalent aryl group, a monovalent heteroaryl group, or a group represented by the $R_1$ and $R_2$ under a condition that at least one of X, Y, or Z represents an aryl group or a heteroaryl group.

In the high-molecular-weight compound according to the present invention, it is suitable that (1) the high-molecular-weight compound is a copolymer having at least one substituted triarylamine structural unit represented by the following general formula (1) and further including a structural unit having at least one aromatic hydrocarbon ring or a structural unit having a substituted triarylamine skeleton different from that represented by the general formula (1) in addition to the at least one substituted triarylamine structural unit, (2) the copolymer has a weight average molecular weight of 10,000 or more and less than 1,000,000 in terms of polystyrene, (3) in the general formula (1), at least one of X, Y, or Z represents an aryl group or a heteroaryl group, specifically, (4) in the general formula (1), X and Y each represent a phenyl group, a biphenylyl group, a terphenyl group, a naphthyl group, a phenanthrenyl group, a fluorenyl group, a naphthylphenyl group, a triphenylenyl group, a dibenzofuranyl group, or a dibenzothienyl group, and $R_1$, $R_2$, and Z each represent a hydrogen atom or a deuterium atom, (5) in the general formula (1), X and Z each represent a phenyl group, a biphenylyl group, a terphenyl group, a naphthyl group, a phenanthrenyl group, a fluorenyl group, a naphthylphenyl group, a triphenylenyl group, a dibenzofuranyl group, or a dibenzothienyl group, and $R_1$, $R_2$, and Y each represent a hydrogen atom or a deuterium atom, and (6) in the general formula (1), any of X, Y, and Z represents a phenyl group, a biphenylyl group, a terphenyl group, a naphthyl group, a phenanthrenyl group, a fluorenyl group, a naphthylphenyl group, a triphenylenyl group, a dibenzofuranyl group, or a dibenzothienyl group, and $R_1$ and $R_2$ each represent a hydrogen atom or a deuterium atom.

In accordance with the present invention, there is also provided an organic EL device including a pair of electrodes and at least one organic layer sandwiched between the electrodes, characterized in that the organic layer includes the high-molecular-weight compound.

In the organic EL device according to the present invention, it is suitable that the organic layer is a hole transport layer, an electron blocking layer, a hole injection layer, or a light-emitting layer.

Advantageous Effects of Invention

The above-mentioned high-molecular-weight compound according to the present invention having at least one substituted triarylamine structural unit represented by the general formula (1) and further including a structural unit having at least one aromatic hydrocarbon ring or a structural unit having a substituted triarylamine skeleton different from that represented by the general formula (1) in addition to the at least one substituted triarylamine structural unit suitably has a weight average molecular weight in a range of 10,000 or more and less than 1,000,000 in terms of polystyrene measured by GPC (gel permeation chromatography).

Such a high-molecular-weight compound has properties of (1) having a good hole injection property,
(2) having large mobility of holes,
(3) being excellent in electron blocking capability,
(4) having high stability in a thin film state, and
(5) having excellent heat resistance.

An organic EL device in which an organic layer formed of such a high-molecular-weight compound, e.g., a hole transport layer, an electron blocking layer, a hole injection layer, or a light-emitting layer, is formed between a pair of electrodes has advantages of (1) having high light emission efficiency and high power efficiency,
(2) having a low practical drive voltage, and
(3) having a long lifetime.

MODE(S) FOR CARRYING OUT THE INVENTION

<Substituted Triarylamine Structural Unit>

Figure 1:
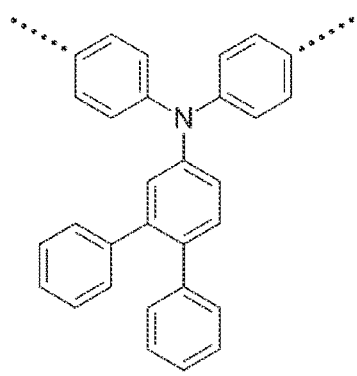
FIG. 1 is a diagram showing chemical structures of structural units 1 to 9 suitable as the substituted triarylamine structural unit represented by the general formula (1) of a high-molecular-weight compound according to the present invention.
Figure 1:
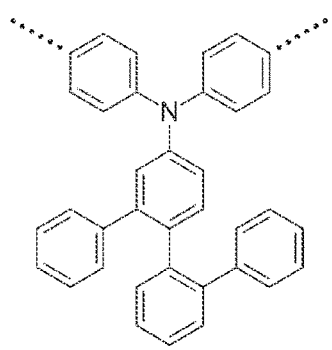
Figure 1:
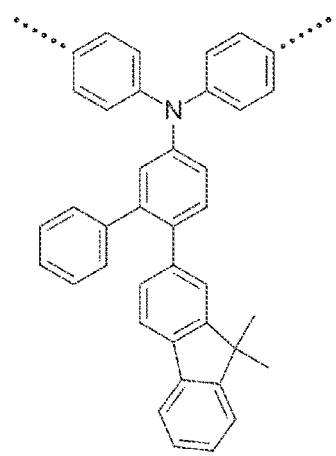
Figure 1:
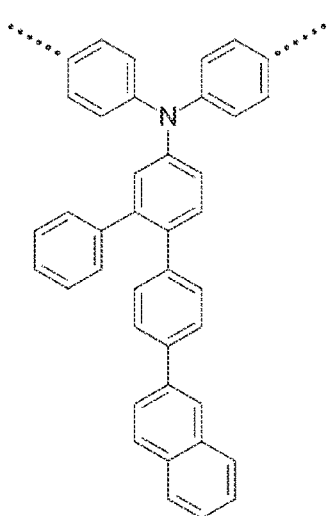
Figure 1:
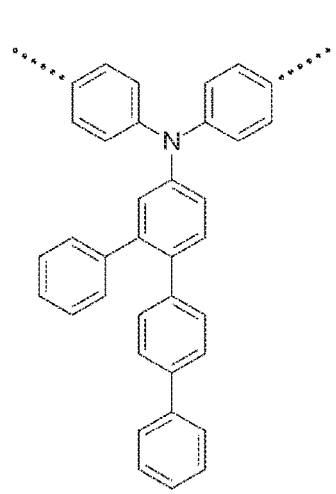
Figure 1:
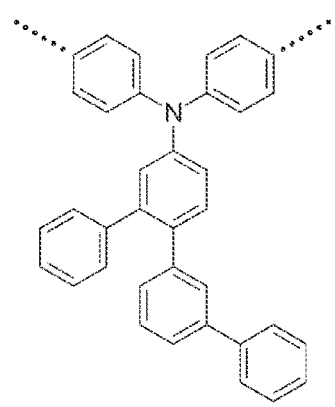
Figure 1:
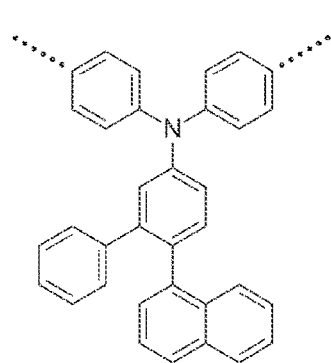
Figure 1:
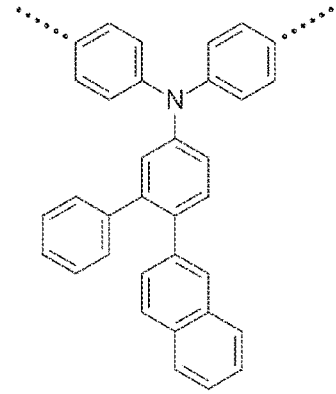
Figure 1:
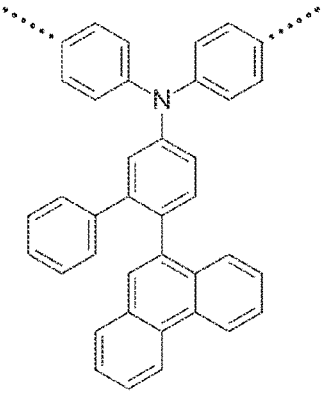
Figure 2:
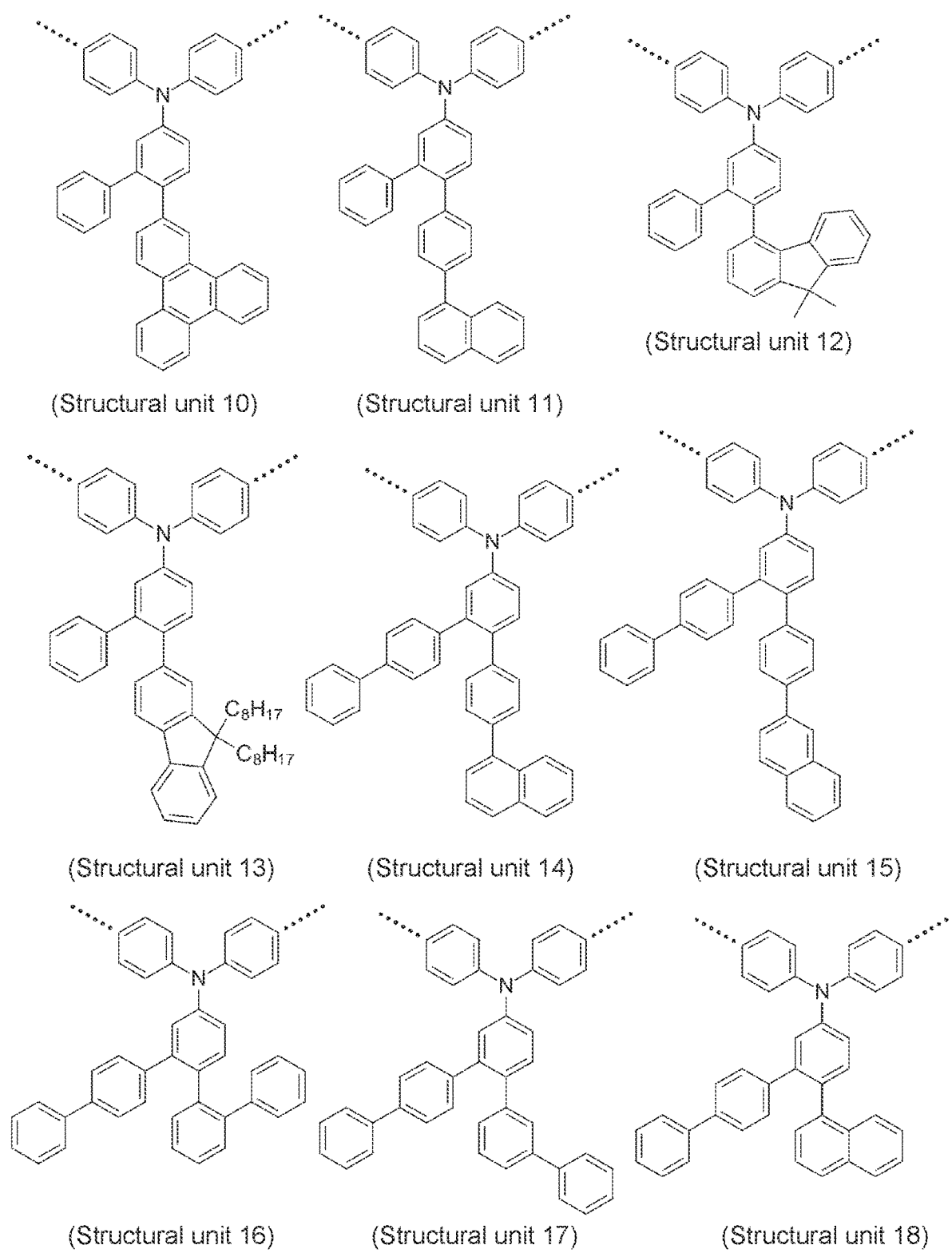
FIG. 2 is a diagram showing chemical structures of structural units 10 to 18 suitable as the substituted triarylamine structural unit represented by the general formula (1) of the high-molecular-weight compound according to the present invention.
Figure 3:
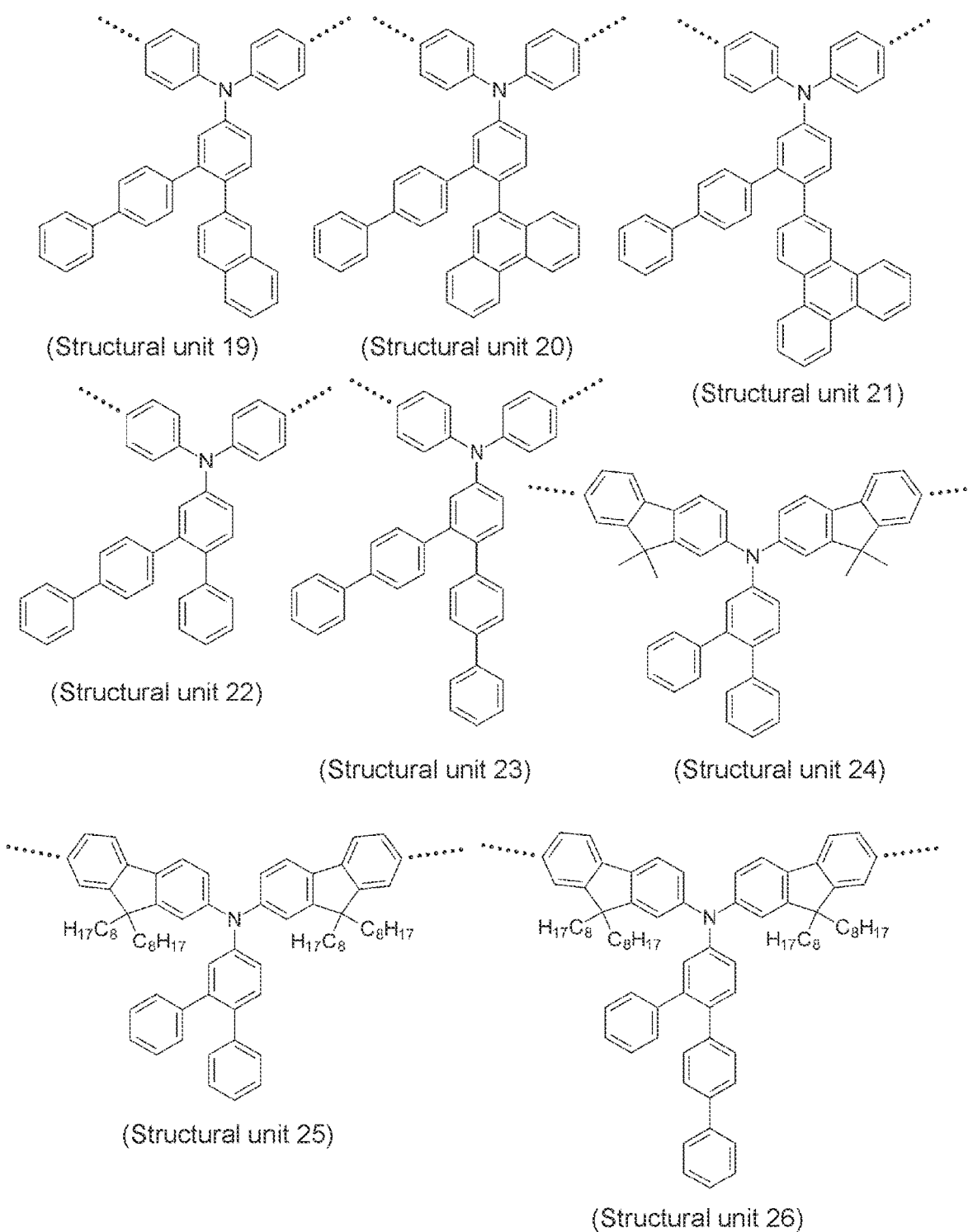
FIG. 3 is a diagram showing chemical structures of structural units 19 to 26 suitable as the substituted triarylamine structural unit represented by the general formula (1) of the high-molecular-weight compound according to the present invention.
Figure 4:
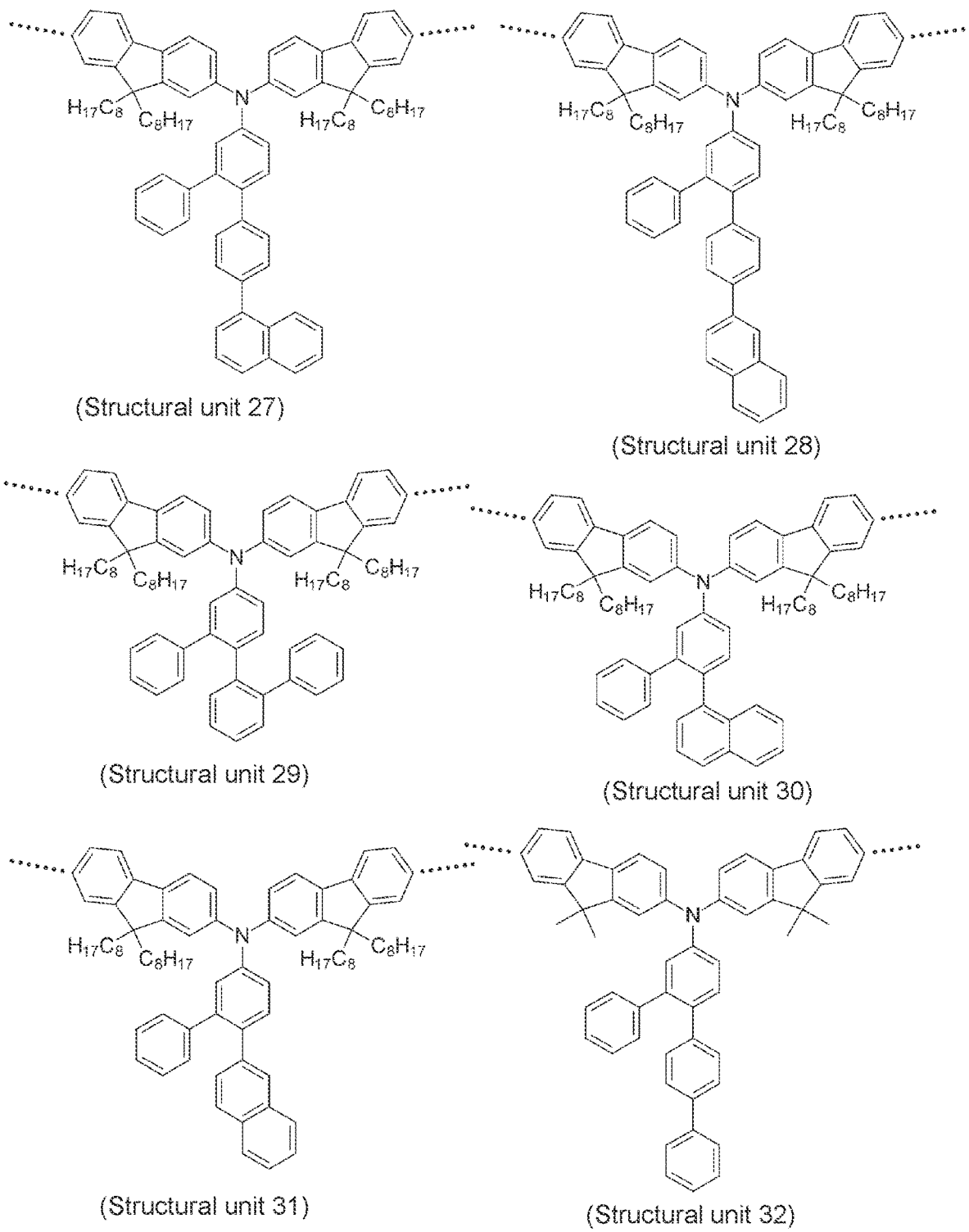
FIG. 4 is a diagram showing chemical structures of structural units 27 to 32 suitable as the substituted triarylamine structural unit represented by the general formula (1) of the high-molecular-weight compound according to the present invention.
Figure 5:
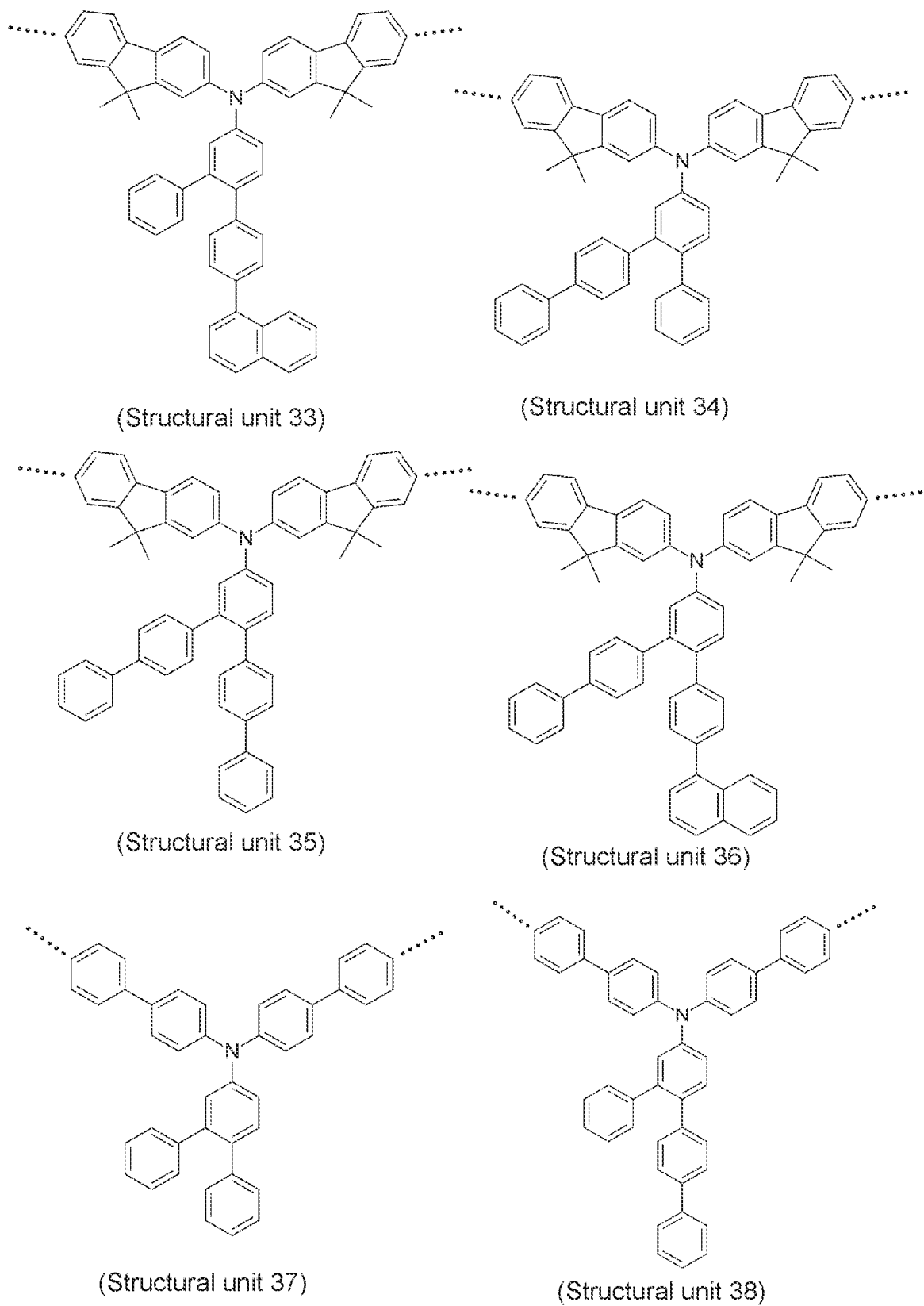
FIG. 5 is a diagram showing chemical structures of structural units 33 to 38 suitable as the substituted triarylamine structural unit represented by the general formula (1) of the high-molecular-weight compound according to the present invention.
Figure 6:
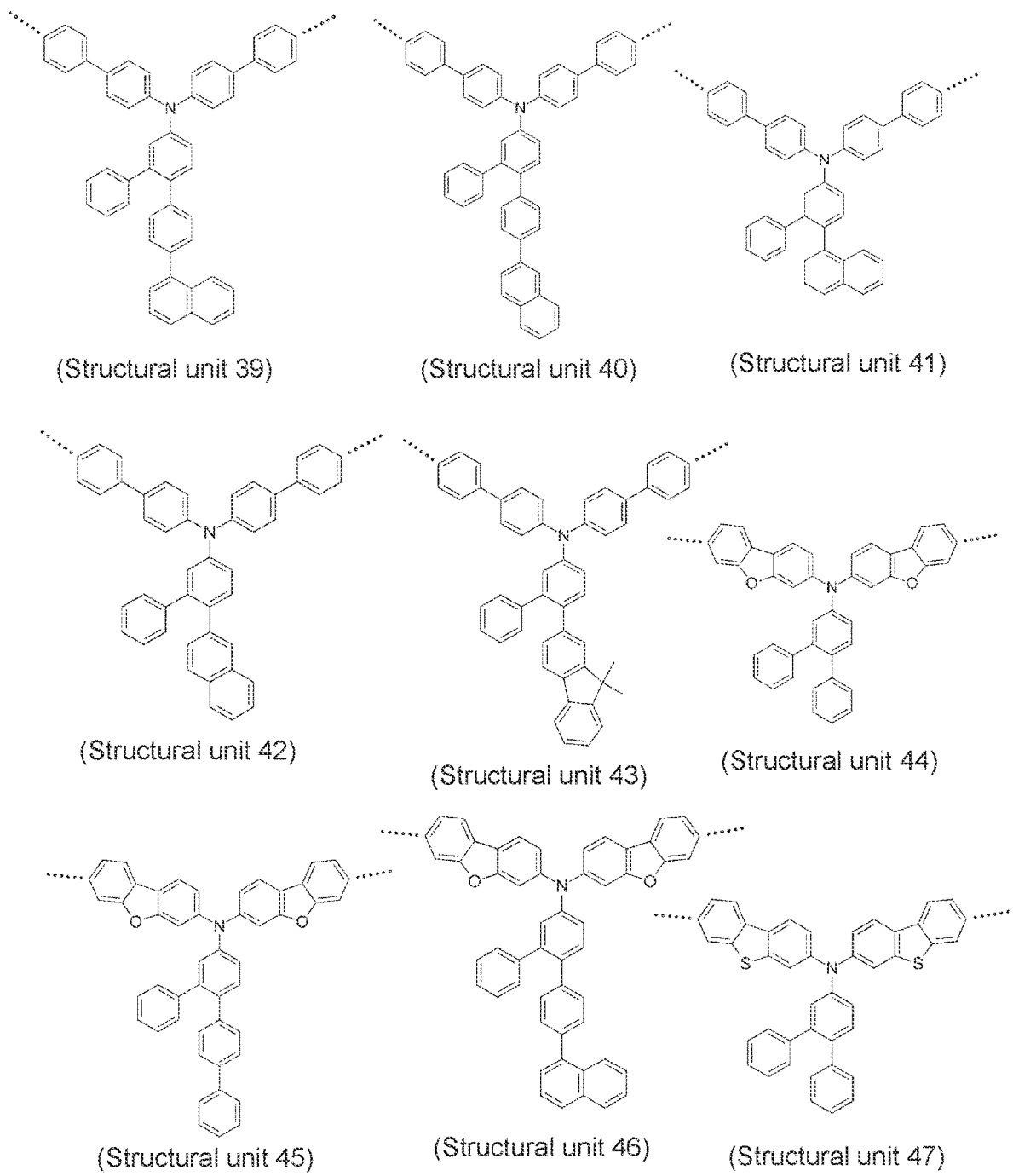
FIG. 6 is a diagram showing chemical structures of structural units 39 to 47 suitable as the substituted triarylamine structural unit represented by the general formula (1) of the high-molecular-weight compound according to the present invention.
Figure 7:
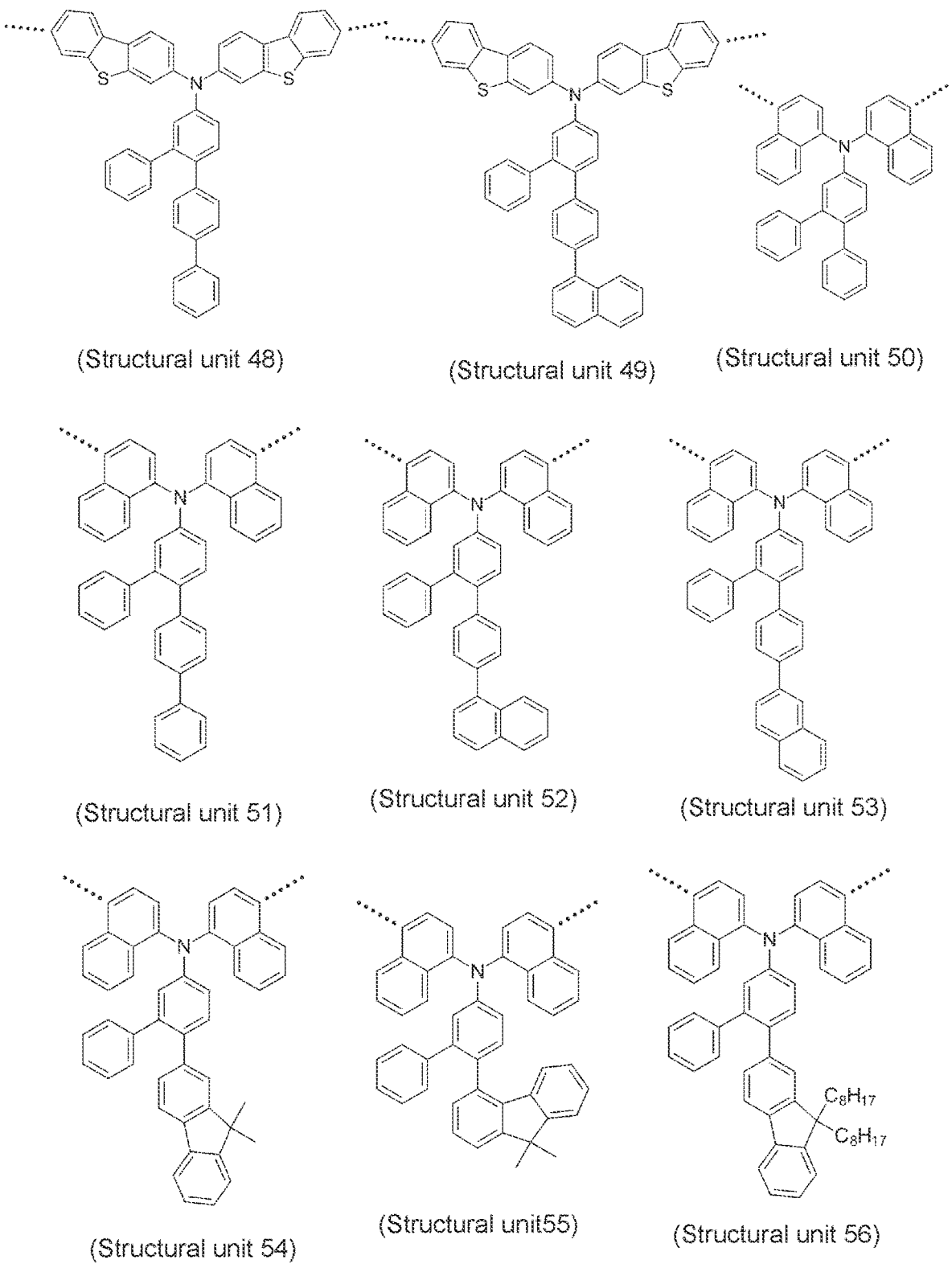
FIG. 7 is a diagram showing chemical structures of structural units 48 to 56 suitable as the substituted triarylamine structural unit represented by the general formula (1) of the high-molecular-weight compound according to the present invention.
Figure 8:
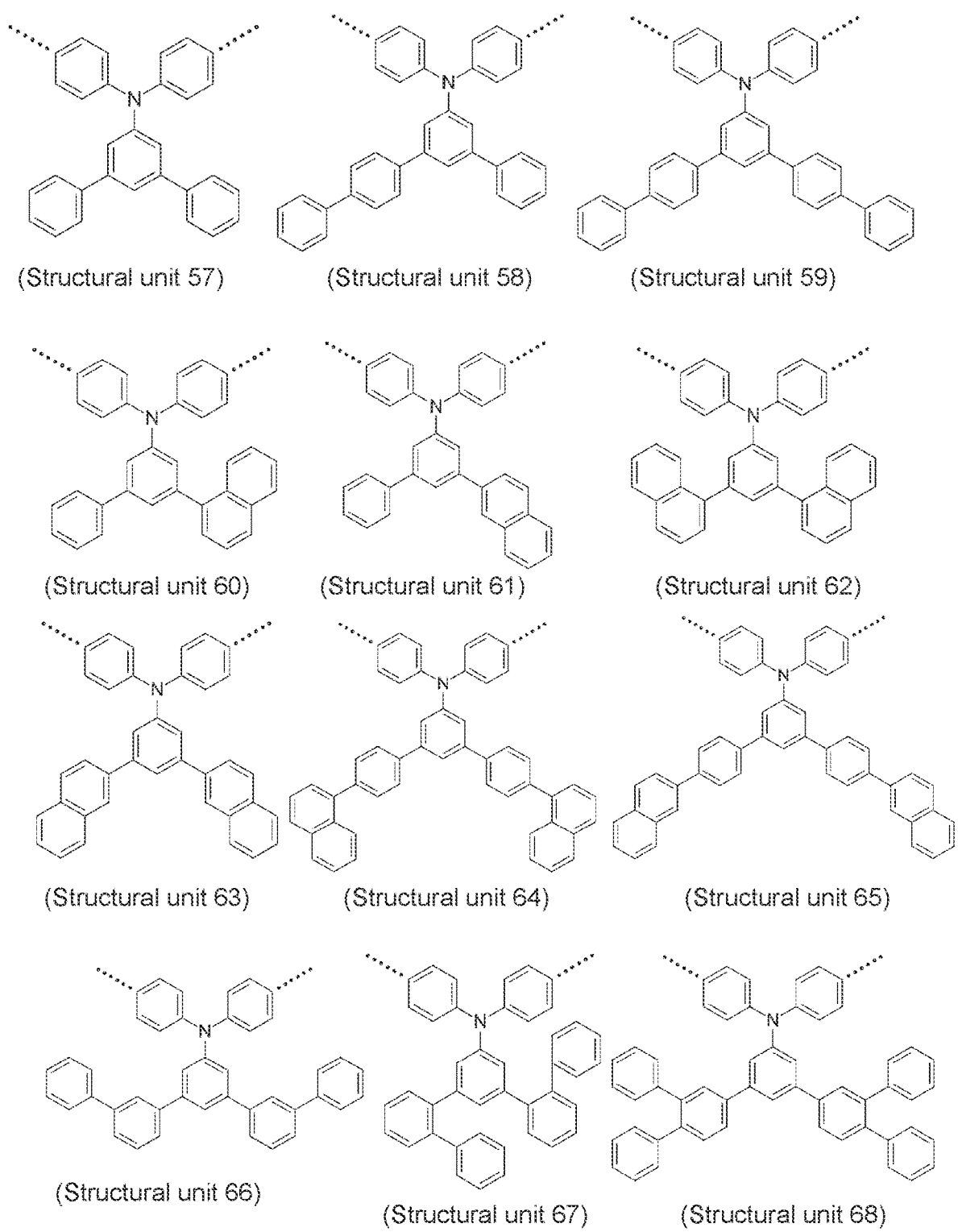
FIG. 8 is a diagram showing chemical structures of structural units 57 to 68 suitable as the substituted triarylamine structural unit represented by the general formula (1) of the high-molecular-weight compound according to the present invention.
Figure 9:
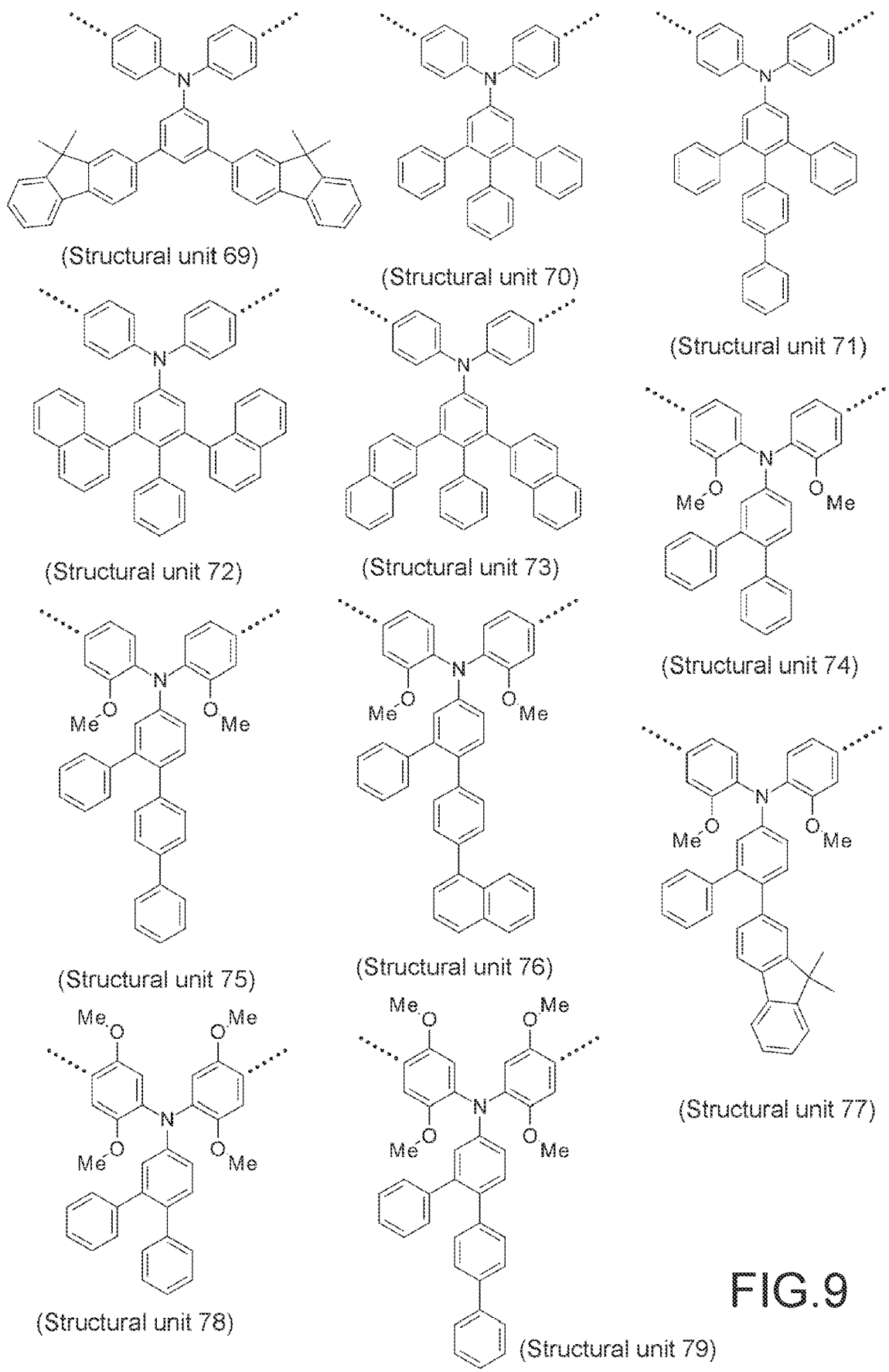
FIG. 9 is a diagram showing chemical structures of structural units 69 to 79 suitable as the substituted triarylamine structural unit represented by the general formula (1) of the high-molecular-weight compound according to the present invention.
Figure 10:
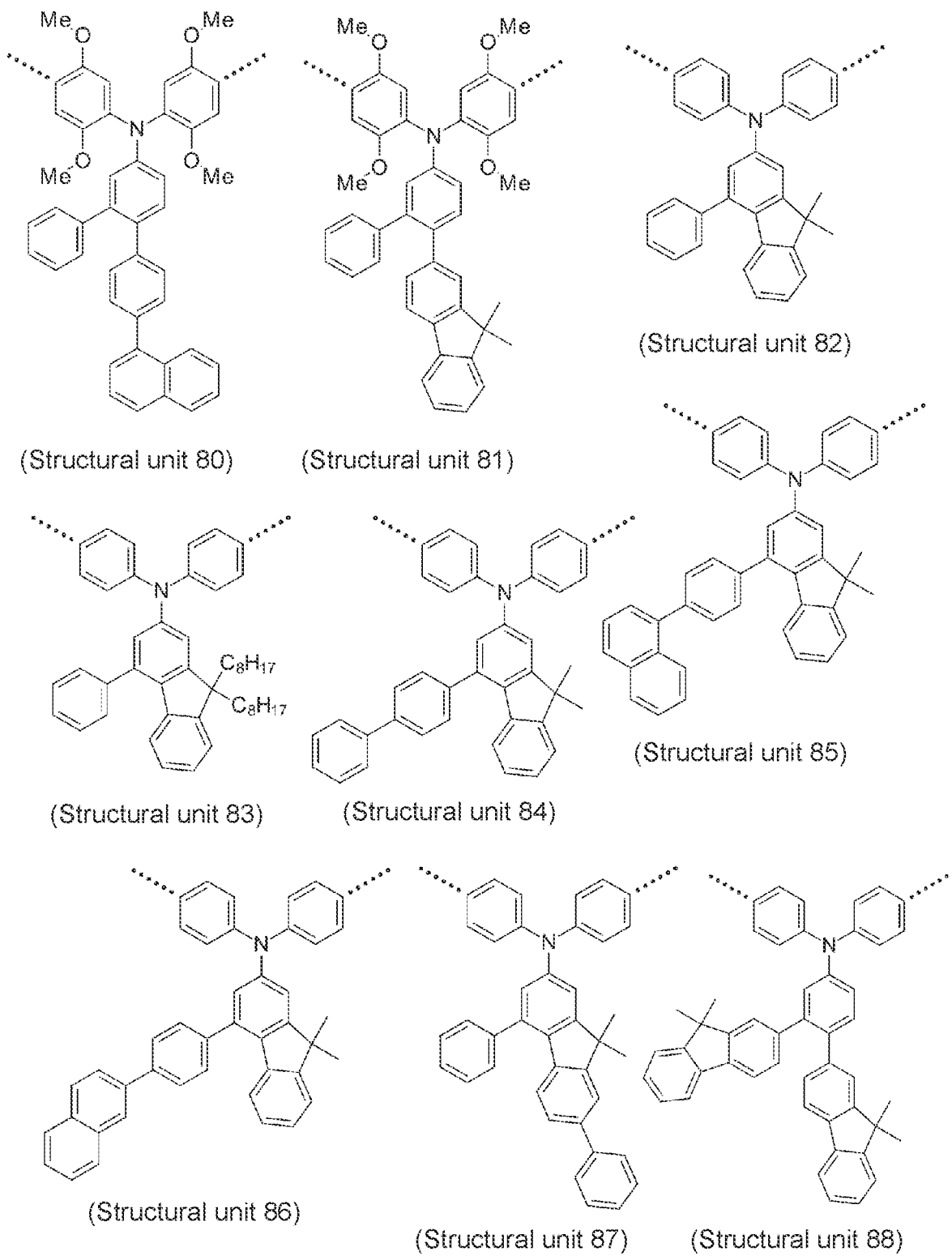
FIG. 10 is a diagram showing chemical structures of structural units 80 to 88 suitable as the substituted triarylamine structural unit represented by the general formula (1) of the high-molecular-weight compound according to the present invention.
Figure 11:
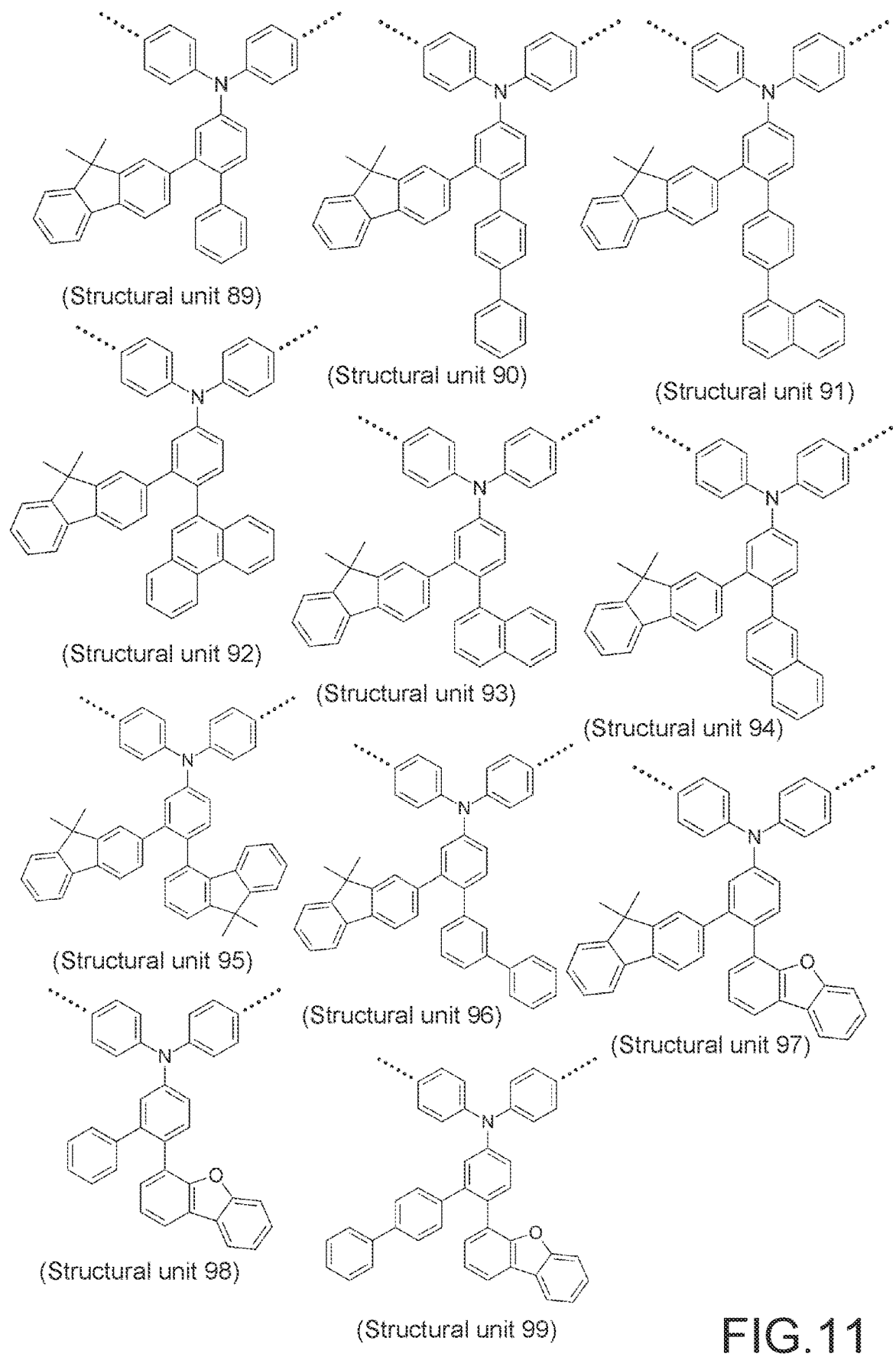
FIG. 11 is a diagram showing chemical structures of structural units 89 to 99 suitable as the substituted triarylamine structural unit represented by the general formula (1) of the high-molecular-weight compound according to the present invention.
Figure 12:
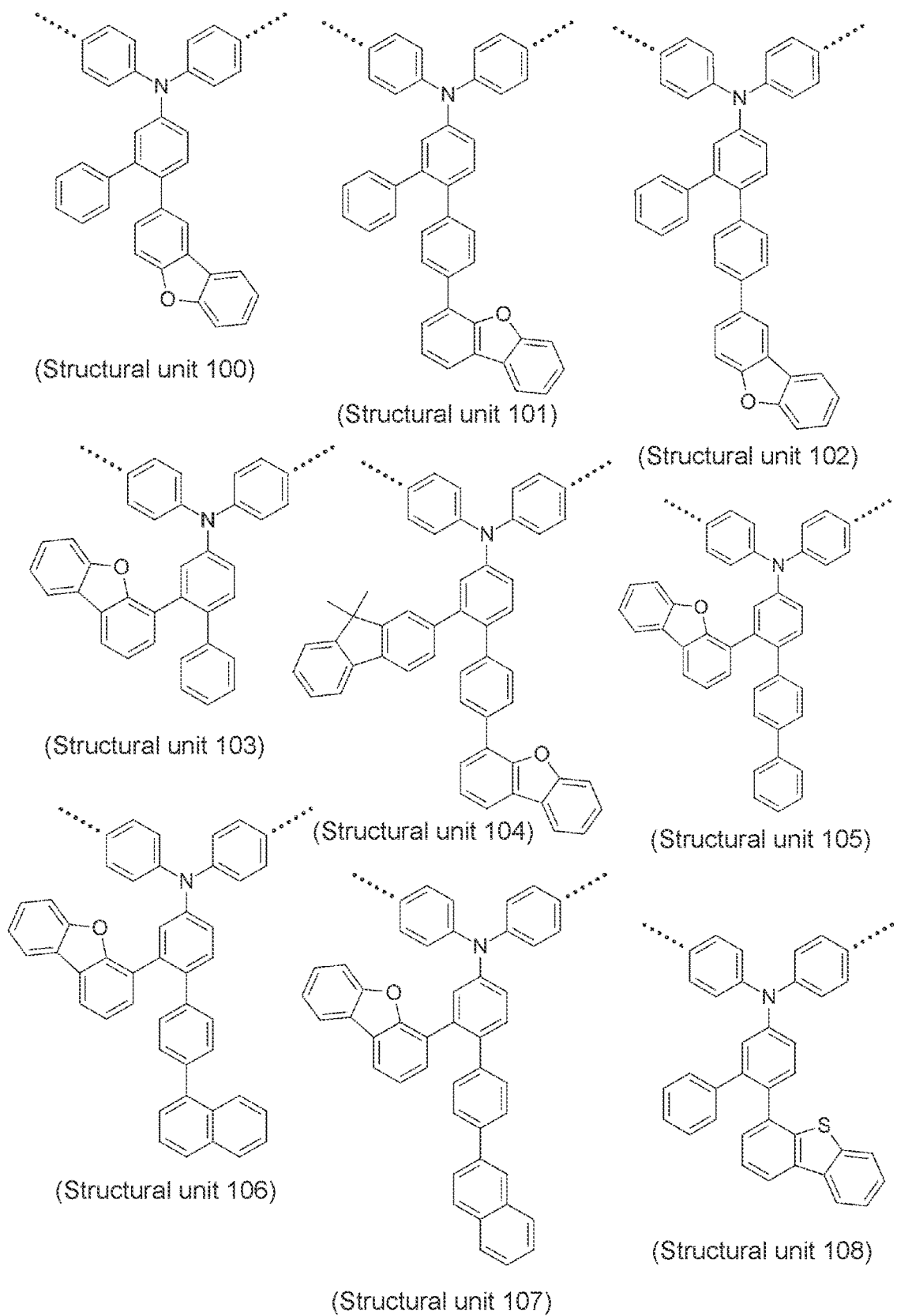
FIG. 12 is a diagram showing chemical structures of structural units 100 to 108 suitable as the substituted triarylamine structural unit represented by the general formula (1) of the high-molecular-weight compound according to the present invention.
Figure 13:
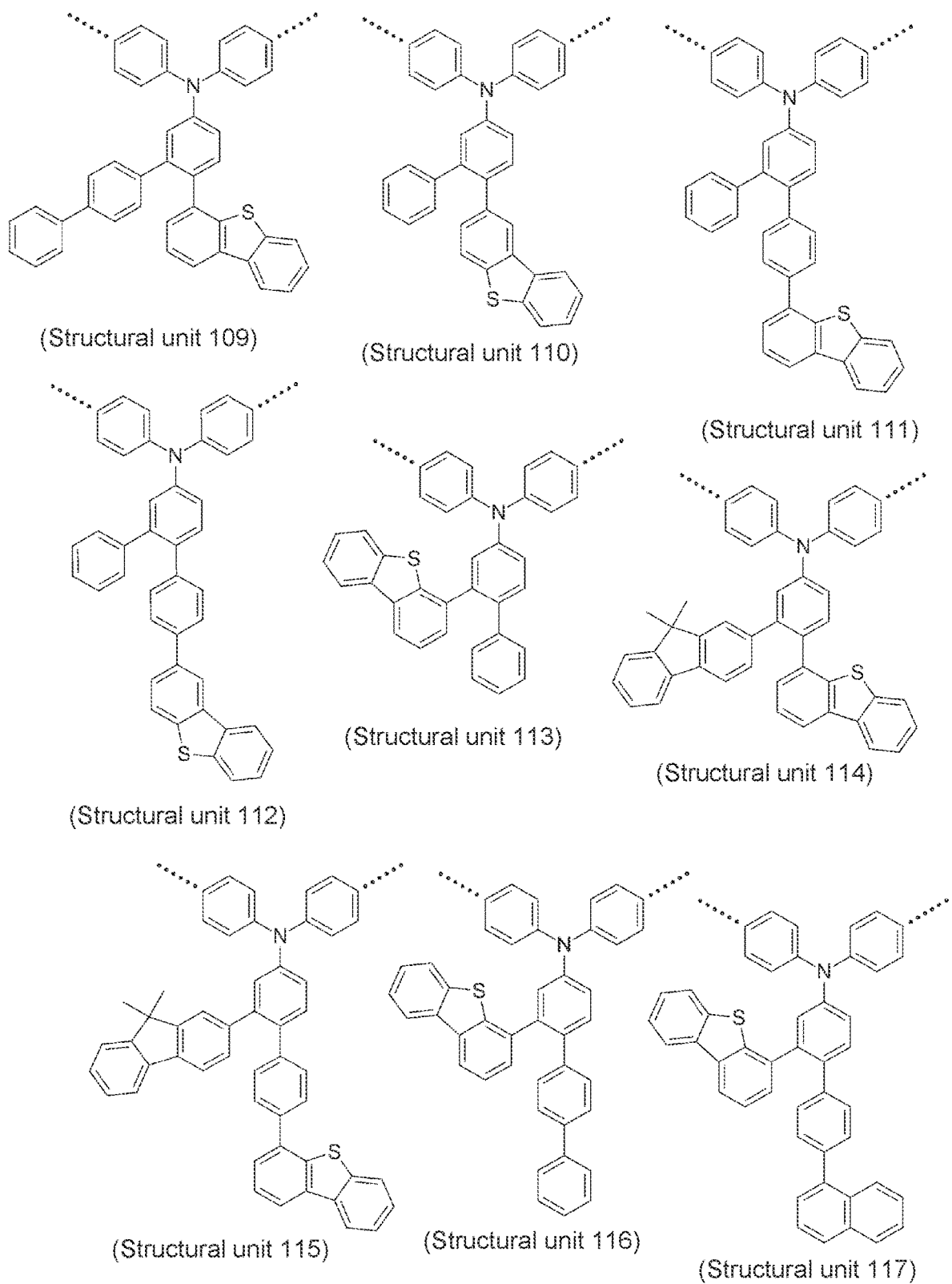
FIG. 13 is a diagram showing chemical structures of structural units 109 to 117 suitable as the substituted triarylamine structural unit represented by the general formula (1) of the high-molecular-weight compound according to the present invention.
Figure 14:
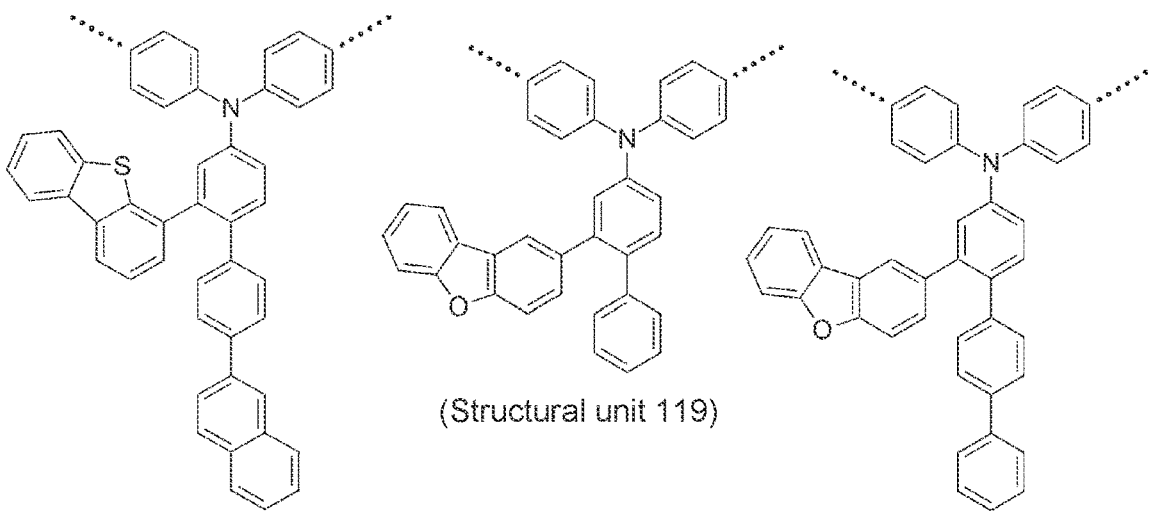
FIG. 14 is a diagram showing chemical structures of structural units 118 to 126 suitable as the substituted triarylamine structural unit represented by the general formula (1) of the high-molecular-weight compound according to the present invention.
Figure 14:
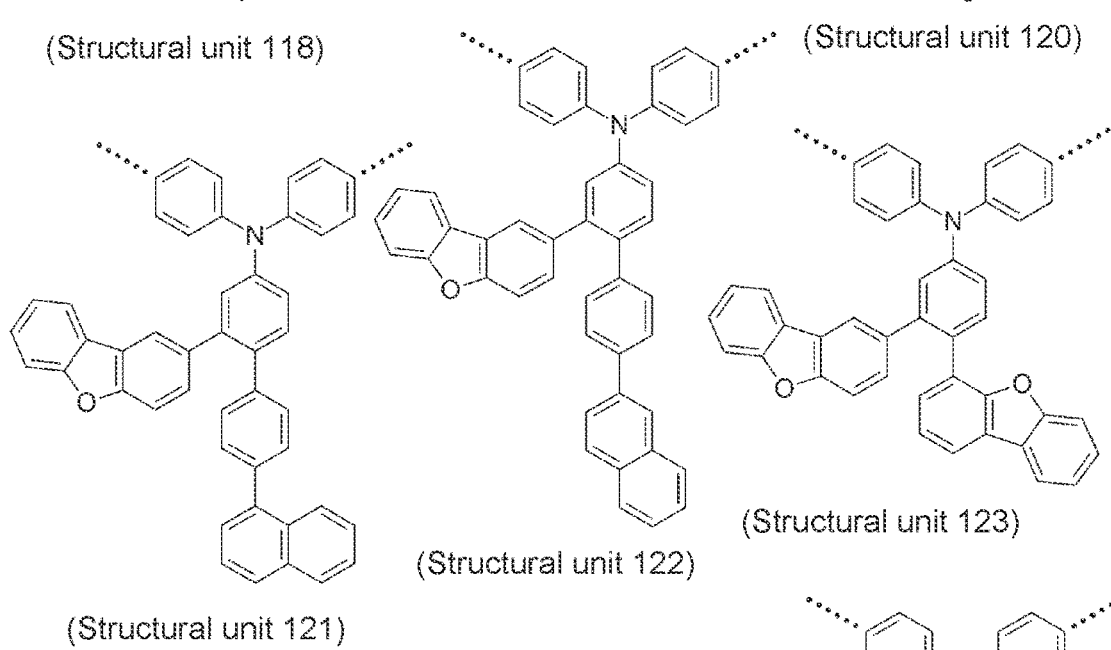
Figure 14:
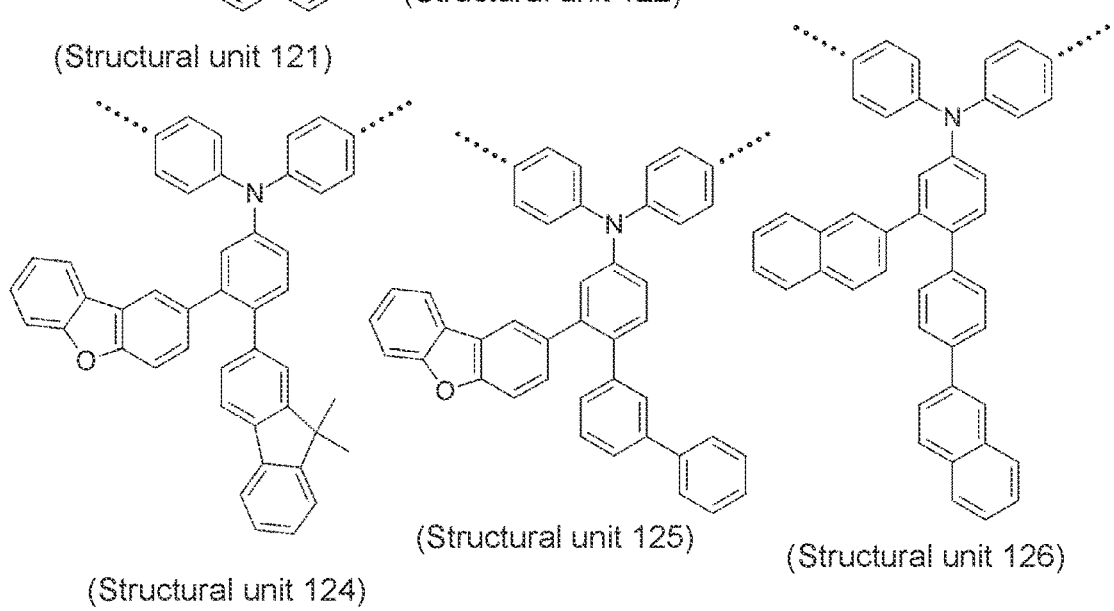
Figure 15:
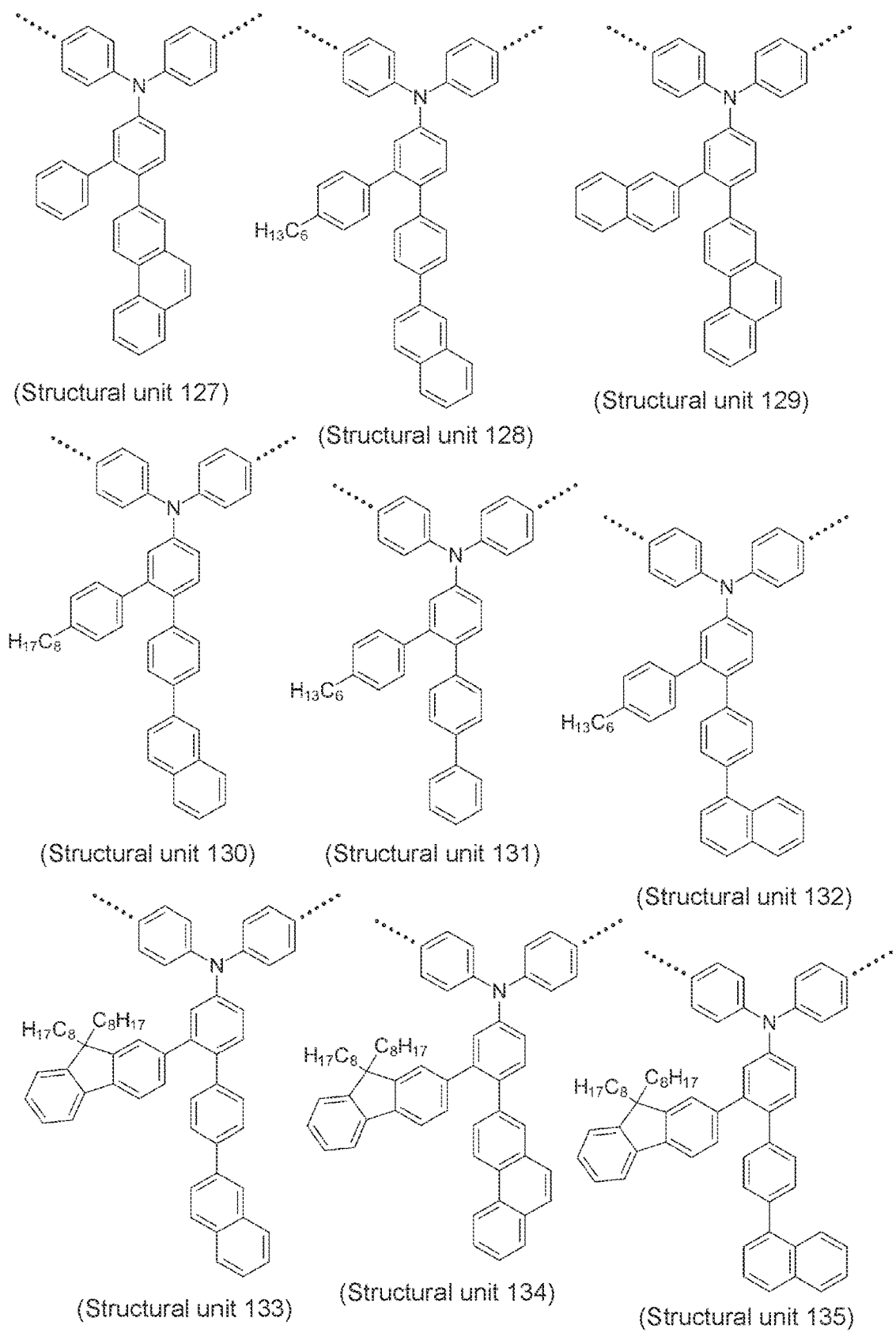
FIG. 15 is a diagram showing chemical structures of structural units 127 to 135 suitable as the substituted triarylamine structural unit represented by the general formula (1) of the high-molecular-weight compound according to the present invention.
Figure 16:
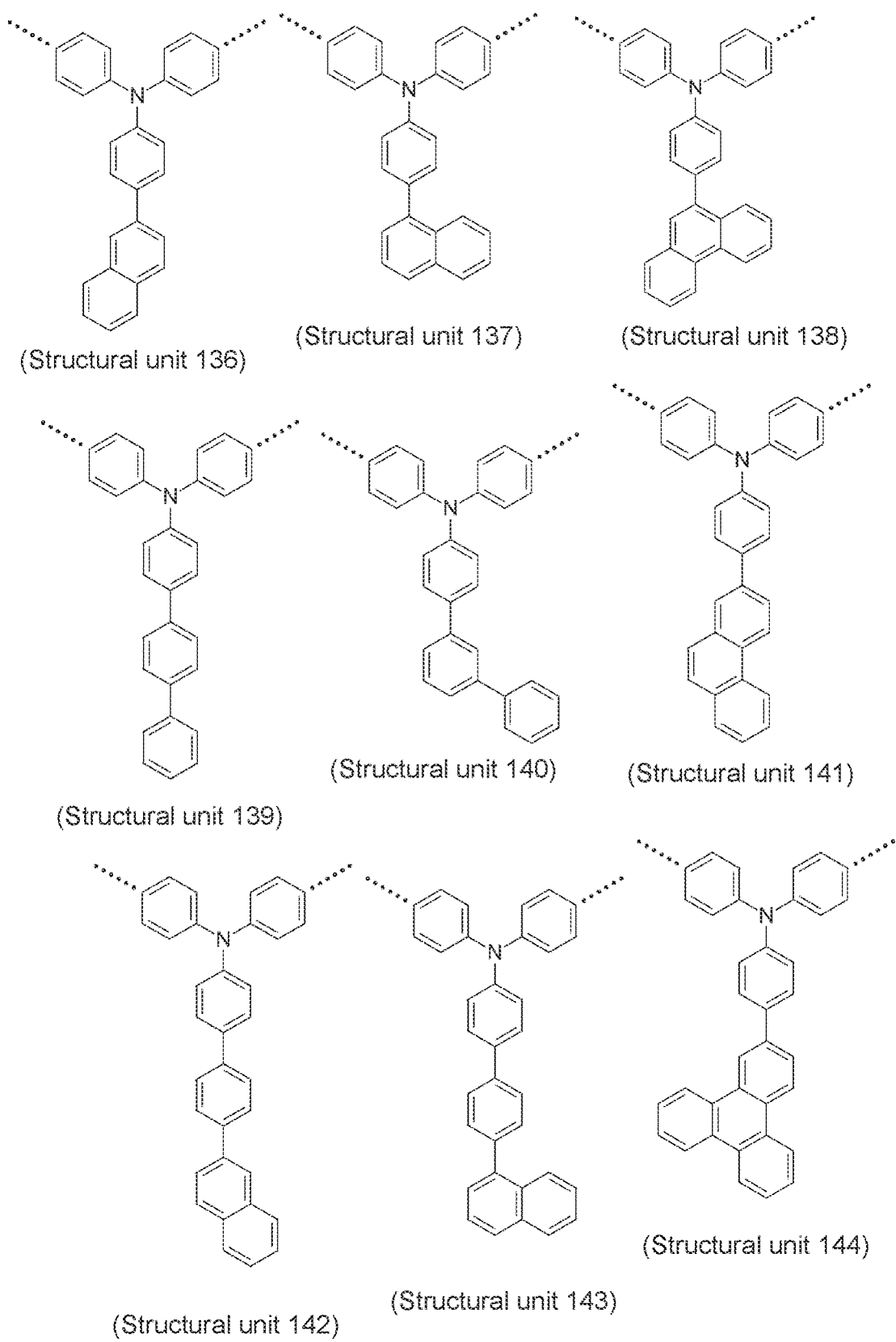
FIG. 16 is a diagram showing chemical structures of structural units 136 to 144 suitable as the substituted triarylamine structural unit represented by the general formula (1) of the high-molecular-weight compound according to the present invention.
Figure 17:
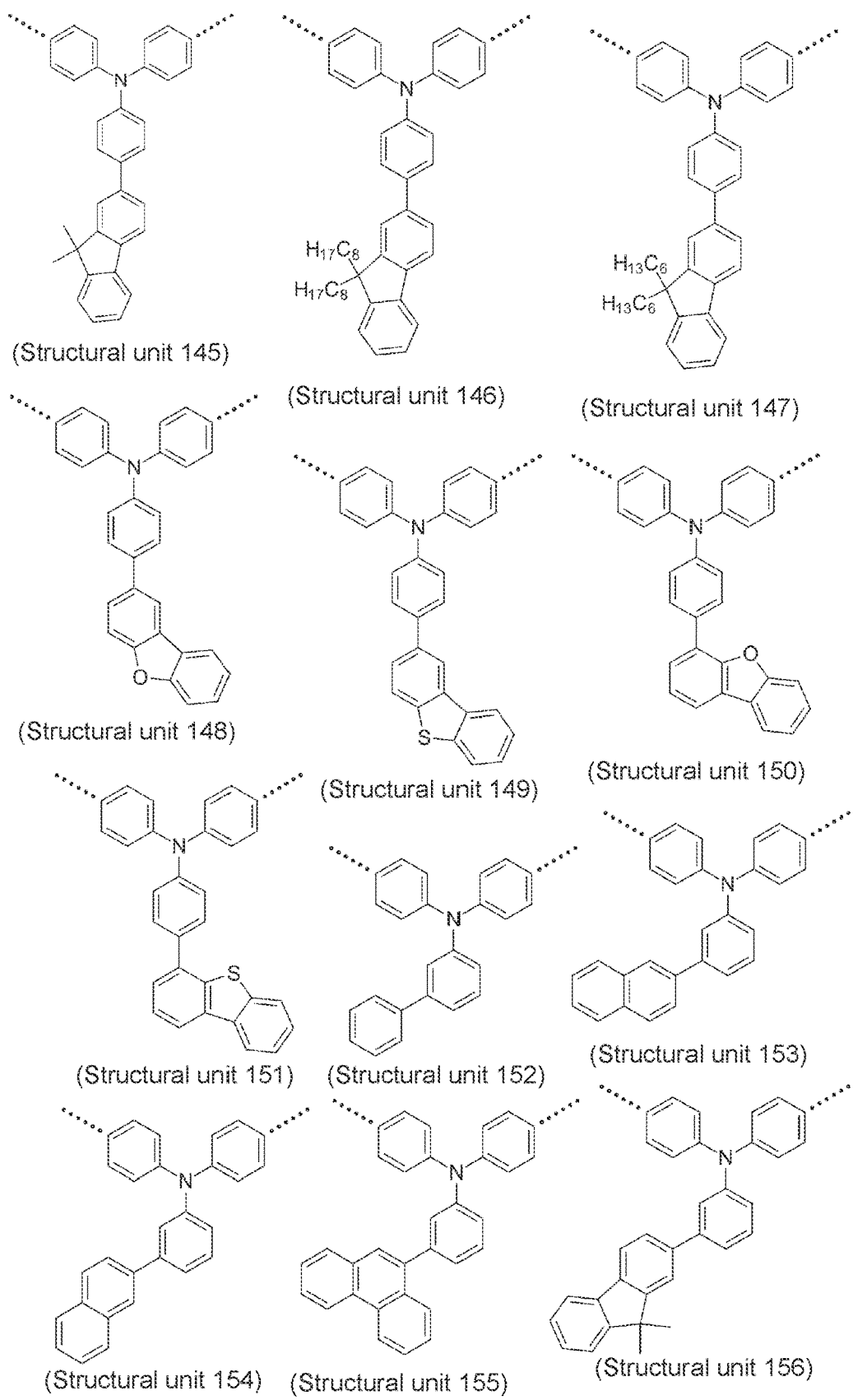
FIG. 17 is a diagram showing chemical structures of structural units 145 to 156 suitable as the substituted triarylamine structural unit represented by the general formula (1) of the high-molecular-weight compound according to the present invention.
Figure 18:
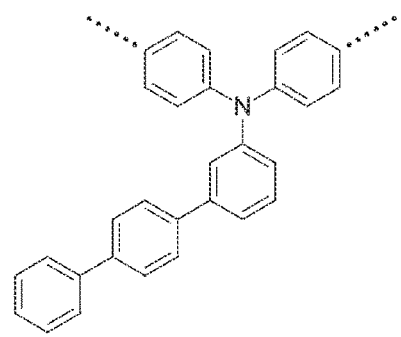
FIG. 18 is a diagram showing chemical structures of structural units 157 to 165 suitable as the substituted triarylamine structural unit represented by the general formula (1) of the high-molecular-weight compound according to the present invention.
Figure 18:
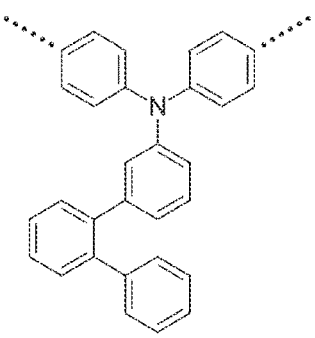
Figure 18:
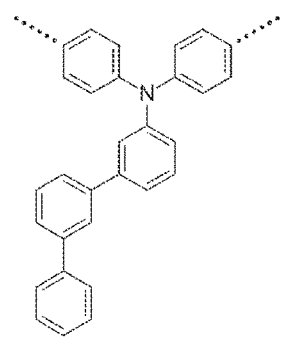
Figure 18:
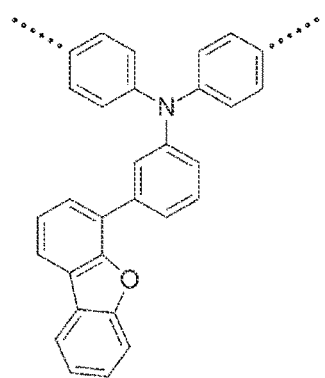
Figure 18:
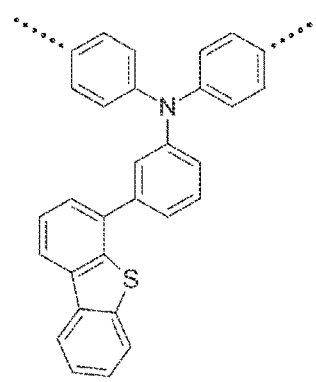
Figure 18:
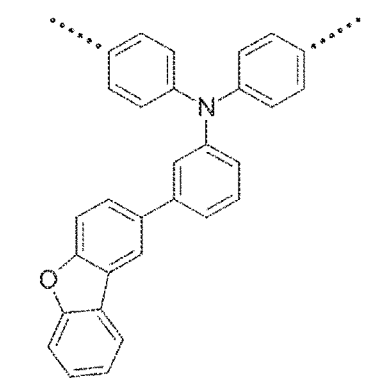
Figure 18:
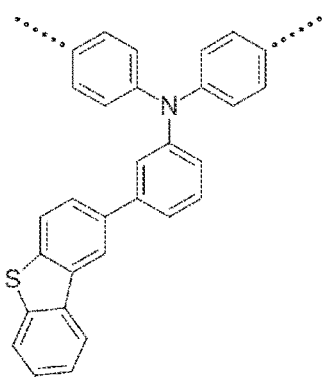
Figure 18:
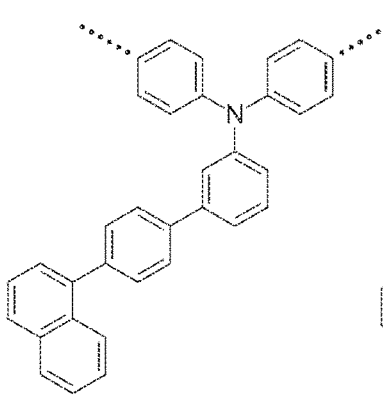
Figure 18:
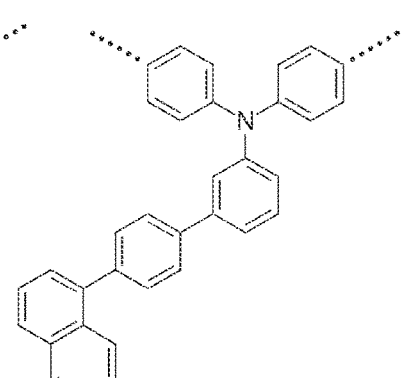

A substituted triarylamine structural unit of a high-molecular-weight compound according to the present invention is a divalent group and is represented by the following general formula (1).

(Chem. 2)

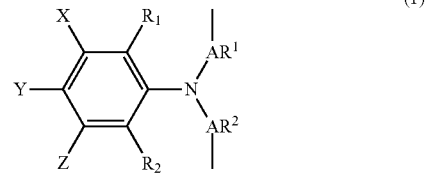

(1)

In the general formula (1), $AR^1$ and $AR^2$ each represent a divalent aryl group or a divalent heteroaryl group, and $AR^1$ and $AR^2$ may be the same group as each other.

The aromatic ring of the divalent aryl group described above may be a single ring or a fused ring. Examples of such an aromatic ring include a benzene ring, a naphthalene ring, an anthracene ring, a phenanthrene ring, a fluorene ring, an indene ring, a pyrene ring, a perylene ring, and a fluoran ring. Further, these aromatic rings may each have a substituent group.

Further, the heterocyclic ring of the divalent heteroaryl group may also be a single ring or a fused ring. Examples of such a heterocyclic ring include a pyridine ring, a pyrimidine ring, a triazine ring, a quinoline ring, an isoquinoline ring, a benzofuran ring, a benzothiophene ring, an indole ring, a carbazole ring, a benzoxazole ring, a benzothiazole ring, a quinoxaline ring, a benzimidazole ring, a pyrazoline ring, a dibenzofuran ring, a dibenzothiophene ring, a naphthyridine ring, a phenanthroline ring, an acridine ring, and a carboline ring. Further, also these aromatic heterocyclic rings may each have a substituent group.

Examples of the substituent group that the aromatic ring and the aromatic heterocyclic ring described above may each have include the following groups in addition to a deuterium atom, a cyano group, a nitro group, and the like.

A halogen atom such as a fluorine atom, a chlorine atom, a bromine atom, and an iodine atom;

an alkyl group, particularly, those having 1 to 8 carbon atoms, such as a methyl group, an ethyl group, an n-propyl group, an isopropyl group, an n-butyl group, an isobutyl group, a tert-butyl group, an n-pentyl group, an isopentyl group, a neopentyl group, an n-hexyl group, an isohexyl group, a neohexyl group, an n-heptyl group, an isoheptyl group, a neoheptyl group, an n-octyl group, an isooctyl group, and a neooctyl group;

an alkyloxy group, particularly, those having 1 to 8 carbon groups, such as a methyloxy group, an ethyloxy group, and a propyloxy group;

an alkenyl group such as a vinyl group and an allyl group;

an aryloxy group such as a phenyloxy group and a tolyloxy group;

an aryl group such as a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, and a triphenylenyl group;

a heteroaryl group such as a pyridyl group, a pyrimidinyl group, a triazinyl group, a thienyl group, a furil group, a pyrrolyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, a carbolinyl group;

an arylvinyl group such as a styryl group and a naphthylvinyl group; and an acyl group such as an acetyl group and a benzoyl group.

Further, each of these substituent groups may further have the substituent group exemplified above.

Further, it is favorable that these substituent groups are each independently present, but these substituent groups may be bonded to each other via a single bond, a methylene group that may have a substituent group, an oxygen atom, or a sulfur atom to form a ring.

In the present invention, as the $AR^1$ and $AR^2$, a naphthyl group, a phenanthrenyl group, a dibenzofuranyl group, a dibenzothienyl group, and a fluorenyl group having a substituent group are favorable, and an unsubstituted phenyl group is most favorable. Note that as the substituent group of the fluorenyl group, a methyl group, an ethyl group, an n-propyl group, an n-butyl group, an n-pentyl group, an n-hexyl group, an n-heptyl group, an n-octyl group, and a phenyl group are suitable.

In the general formula (1), $R_1$ and $R_2$ may be the same as each other and each represent a hydrogen atom, a deuterium atom, a fluorine atom, a chlorine atom, a cyano group, a nitro group, an alkyl group having 1 to 8 carbon atoms, a cycloalkyl group having 5 to 10 carbon atoms, an alkenyl group having 2 to 6 carbon atoms, an alkyloxy group having 1 to 6 carbon atoms, or a cycloalkyloxy group having 5 to 10 carbon atoms.

In such $R_1$ and $R_2$, examples of the alkyl group, the cycloalkyl group, the alkenyl group, the alkyloxy group, and the cycloalkyloxy group described above include the following groups.

An alkyl group ($C_1$ to $C_8$) such as a methyl group, an ethyl group, an n-propyl group, an isopropyl group, an n-butyl group, an isobutyl group, a tert-butyl group, an n-pentyl group, an isopentyl group, a neopentyl group, an n-hexyl group, and an n-octyl group;

a cycloalkyl group ($C_5$ to $C_{10}$) such as a cyclopentyl group, a cyclohexyl group, a 1-adamantyl group, and a 2-adamantyl group;

an alkenyl group ($C_2$ to $C_6$) such as a vinyl group, an allyl group, an isopropenyl group, and a 2-butenyl group;

an alkyloxy group ($C_1$ to $C_6$) such as a methyloxy group, an ethyloxy group, an n-propyloxy group, an isopropyloxy group, an n-butyloxy group, a tert-butyloxy group, an n-pentyloxy group, and an n-hexyloxy group; and a cycloalkyloxy group ($C_5$ to $C_{10}$) such as a cyclopentyloxy group, a cyclohexyloxy group, a cycloheptyloxy group, a cyclooctyloxy group, a 1-adamantyloxy group, and a 2-adamantyloxy group.

Further, also the groups $R_1$ and $R_2$ described above may each have a substituent group. Also these substituent groups are groups similar to the substituent groups that $AR^1$ and $AR^2$, which are divalent groups, may have, and each of these substituent groups may further have a substituent group similarly to the substituent groups that $AR^1$ and $AR^2$ may have.

Further, it is desirable that the $R_1$ and $R_2$ described above and the various substituent groups are each independently present, but may be bonded to each other to form a ring similarly to the substituent groups that $AR^1$ and $AR^2$ may have.

In the high-molecular-weight compound according to the present invention, the $R_1$ and $R_2$ described above are suitably a hydrogen atom and a deuterium atom, and most suitably a hydrogen atom in terms of synthesis.

In the general formula (1), X, Y, and Z may be the same as each other and each represent an aryl group, a heteroaryl group, or a group similar to those represented by the $R_1$ and $R_2$ under a condition that at least one of X, Y, or Z represents an aryl group or a heteroaryl group.

Examples of the alkyl group, the cycloalkyl group, the alkenyl group, the alkyloxy group, and the cycloalkyloxy group in such X, Y, and Z include groups similar to those exemplified for the $R_1$ and $R_2$ described above. Further, examples of the aryl group and the heteroaryl group include the following groups.

An aryl group;

a phenyl group, a naphthyl group, an anthracenyl group, a phenanthrenyl group, a triphenylenyl group, a fluorenyl group, an indenyl group, a pyrenyl group, a perylenyl group, and a fluoranthenyl group.

a heteroaryl group; and a pyridyl group, a pyrimidinyl group, a triazinyl group, a furil group, a pyrrolyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, and a carbolinyl group.

Further, the aryl group and the heteroaryl group described above may each have a substituent group. Also these substituent groups are groups similar to the substituent groups that $AR^1$ and $AR^2$, which are divalent groups, may have, and each of these substituent groups may further have a substituent group similarly to the substituent groups that $AR^1$ and $AR^2$ may have. For example, the aryl group and the heteroaryl group described above may each have a phenyl group as a substituent group, and this phenyl group may further have a phenyl group as a substituent group. That is, taking a phenyl group as an aryl group as an example, this aryl group may be a biphenylyl group or a terphenylyl group.

Further, it is desirable that the above-mentioned aryl group, heteroaryl group, and various substituent groups are each independently present, but may be bonded to each other to form a ring similarly to the substituent group that $AR^1$ and $AR^2$ may have.

In the present invention, specific examples of the above-mentioned substituted triarylamine structural unit represented by the general formula (1) are shown as structural units 1 to 165 in FIG. 1 to FIG. 18.

Note that in the chemical formulae shown in FIG. 1 to FIG. 18, the dashed line indicates a bonding hand to an adjacent structural unit, and the solid line extending from the ring with a free tip indicates that the free tip is a methyl group unlike the general formula (1).

<High-Molecular-Weight Compound>

The above-mentioned high-molecular-weight compound according to the present invention having a structural unit represented by the general formula (1) is excellent in properties such as a hole injection property, a mobility of holes, electron blocking capability, stability in a thin-film state, and heat resistance, but is favorably a polymer including the structural unit described above as repeating units from the viewpoint of further enhancing these properties and achieving the depositability. For example, the weight average molecular weight measured by GPC in terms of polystyrene is 10,000 or more and less than 1,000,000, more favorably 10,000 or more and less than 500,000, and still more favorably 10,000 or more and less than 200,000.

Further, the high-molecular-weight compound according to the present invention is favorably a copolymer further including a structural unit having at least one aromatic hydrocarbon ring or a structural unit having a substituted triarylamine skeleton different from that represented by the general formula (1) in addition to the structural unit represented by the general formula (1) in order to, for example, achieve the coatability, the adhesion, and the durability when being applied to formation of an organic layer in an organic EL device by coating, and to achieve a higher hole transport property.

Figure 19:
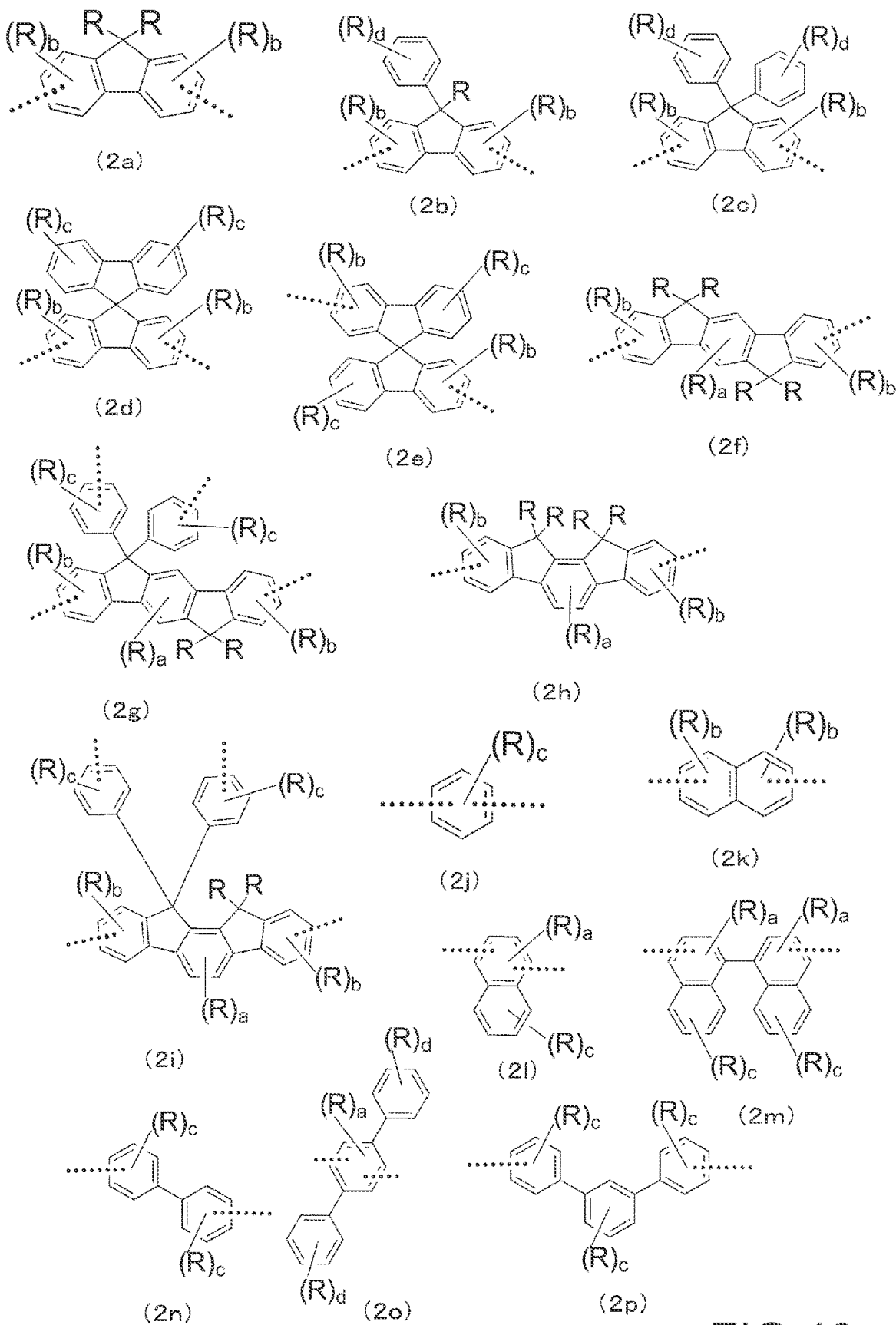
FIG. 19 is a diagram showing chemical structures of structural units (2a) to (2p) introduced to improve the solubility in an organic solvent.
Figure 20:
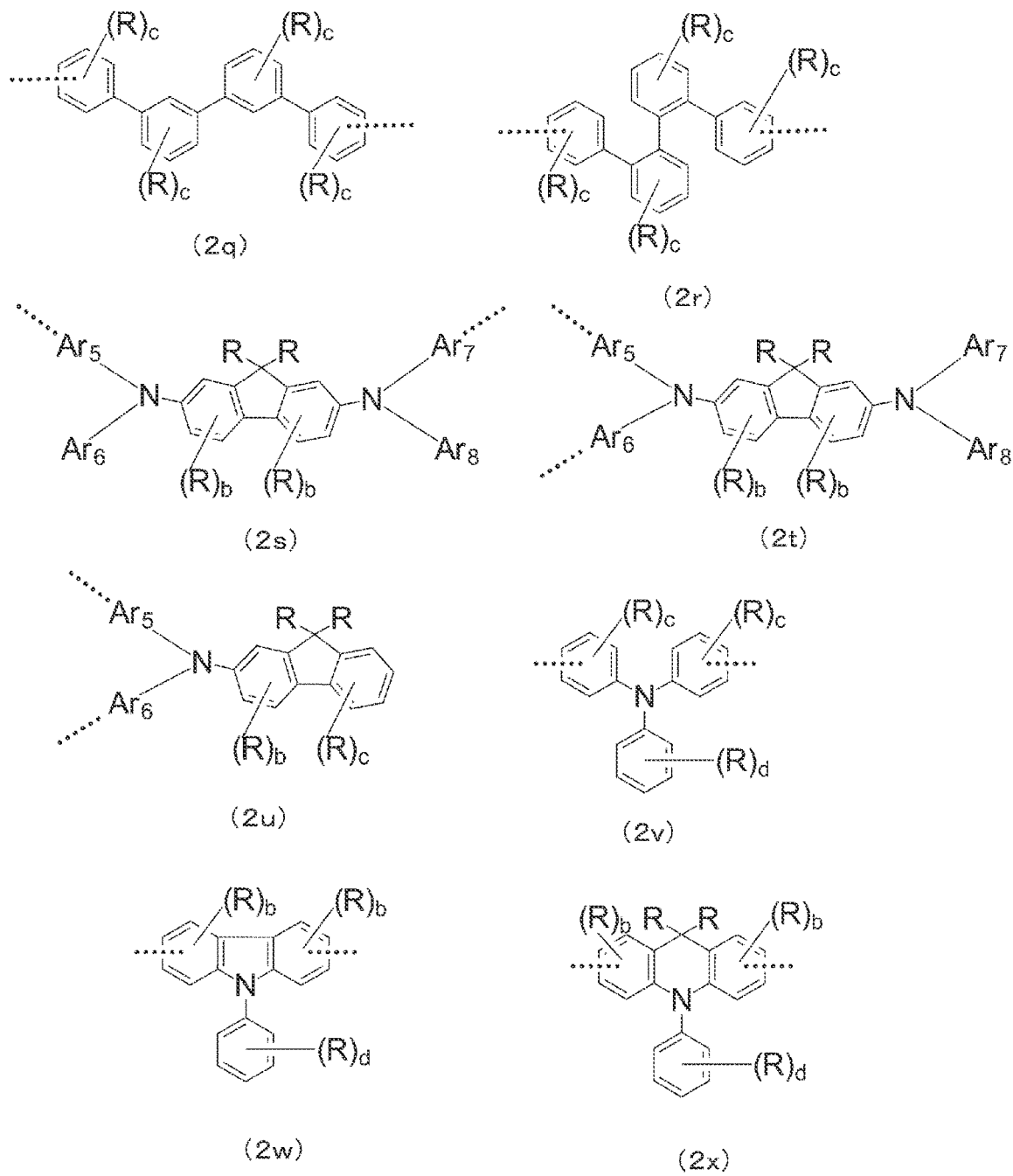
FIG. 20 is a diagram showing chemical structures of structural units (2q) to (2x) introduced to improve the solubility in an organic solvent.

Examples of the structural unit having an aromatic hydrocarbon ring, which is favorable for copolymerizing with the general formula (1) include a structural unit for enhancing the solubility in an organic solvent. The structural unit for enhancing the solubility in an organic solvent has at least one aromatic hydrocarbon ring, and specific examples thereof are shown in formulae (2a) to (2x) in FIG. 19 and FIG. 20.

Note that in the formulae (2a) to (2x) described above, the dashed line indicates a bonding hand to an adjacent structural unit, and the solid line extending from the ring with a free tip indicates that the tip is a methyl group.

Further, in the formulae (2a) to (2x) described above, a to d each represent the number of Rs and the following numbers.

a=0, 1, or 2
b=0, 1, 2, or 3
c=0, 1, 2, 3, or 4
d=0, 1, 2, 3, 4, or 5

Further, in the formulae (2a) to (2x), R represents a hydrogen atom, a deuterium atom, a cyano group, or a nitro group; a halogen atom such as a fluorine atom, a chlorine atom, a bromine atom, and an iodine atom; and an alkyl group, a cycloalkyl group, an alkoxy group, and a thioalkoxy group that respectively have 40 carbon atoms or less (particularly 3 to 40).

Further, $Ar_5$ to $Ar_8$ may be the same as or different from each other and each represent a monovalent or divalent aryl group or heteroaryl group. Examples of such a monovalent or divalent aryl group or heteroaryl group include groups similar to the groups exemplified as an aryl group or a heteroaryl group for the groups $AR^1$ and $AR^2$ in the general formula (1). Note that also the monovalent or divalent aryl group or heteroaryl group described above may have a substituent group similarly to the groups $AR^1$ and $AR^2$.

Specific examples of the structural unit having a substituted triarylamine skeleton different from that represented by the general formula (1), which is favorable for copolymerizing with the general formula (1) are shown in the following formula (3).

(Chem. 3)

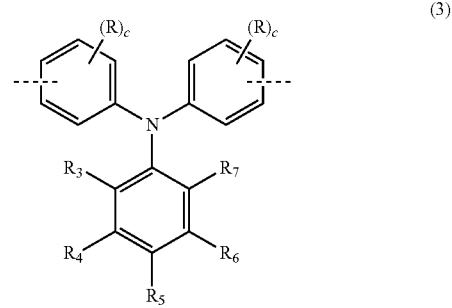

(3)

In the formula (3), the dashed line, R, and c have the same meaning as those in the formulae (2a) to (2x). $R_3$ to $R_7$ may be the same as each other and each represent a hydrogen atom, a deuterium atom, a fluorine atom, a chlorine atom, a cyano group, a nitro group, an alkyl group having 1 to 8 carbon atoms, or an alkyloxy group.

In the high-molecular-weight compound according to the present invention, when the structural unit represented by the general formula (1), the structural unit having an aromatic hydrocarbon ring represented by the formulae (2a) to (2x) for improving the solubility in an organic solvent, and the structural unit having a substituted triarylamine skeleton different from that represented by the general formula (1), which is represented by the formula (3) are respectively represented as a structural unit A, a structural unit B, and a structural unit C, it is favorable to contain 1 mol % or more, particularly 5 mol % or more, of the structural unit A, and contain, under the condition that the structural unit A is contained in such an amount, 1 mol % or more, particularly 30 to 90 mol %, of the structural unit B and 1 mol % or more, particularly 5 to 90 mol %, of the structural unit C, and it is most suitable for forming an organic layer of an organic EL device that the high-molecular-weight compound is a terpolymer including the structural unit A, the structural unit B, and the structural unit C so as to satisfy such a condition.

Further, also a bipolymer that contains 1 mol % or more, particularly 5 mol % or more, of the structural unit A, and 1 mol % or more, particularly 30 to 90 mol %, of the structural unit B under the condition that the structural unit A is contained in such an amount is suitable for forming an organic layer of an organic EL device.

Such a high-molecular-weight compound according to the present invention is synthesized by forming a C—C bond or a C—N bond by a Suzuki polymerization reaction or a HARTWIG-BUCHWALD polymerization reaction to chain the respective structural units.

That is, the high-molecular-weight compound according to the present invention can be synthesized by preparing a unit compound having the respective structural units, appropriately making this unit compound borate-esterified or halogenated, and performing a polycondensation reaction using an appropriate catalyst.

For example, as the compound for introducing the structural unit A represented by the general formula (1), a triarylamine derivative represented by the following general formula (1a) can be used.

(Chem. 4)

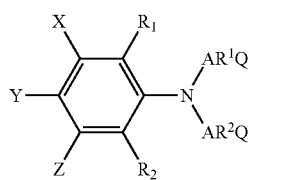
(1a)

In the formula described above, Q represents a hydrogen atom or a halogen atom (particularly, Br), $AR^1$, $AR^2$, X, Y, Z, and $R_1$ and $R_2$ are the same as those shown in the general formula (1).

That is, in the general formula (1a) described above, one in which Q represents a hydrogen atom is a unit compound for introducing the structural unit A represented by the general formula (1), and one in which Q represents a halogen atom is a halide used for synthesizing a polymer.

For example, a terpolymer containing 40 mol % of the structural unit A represented by the general formula (1), 50 mol % of the structural unit B represented by the formula (2a) for improving the solubility in an organic solvent, and 10 mol % of the structural unit C having a triarylamine skeleton represented by the formula (3) is represented by the following general formula (4).

(Chem. 5)

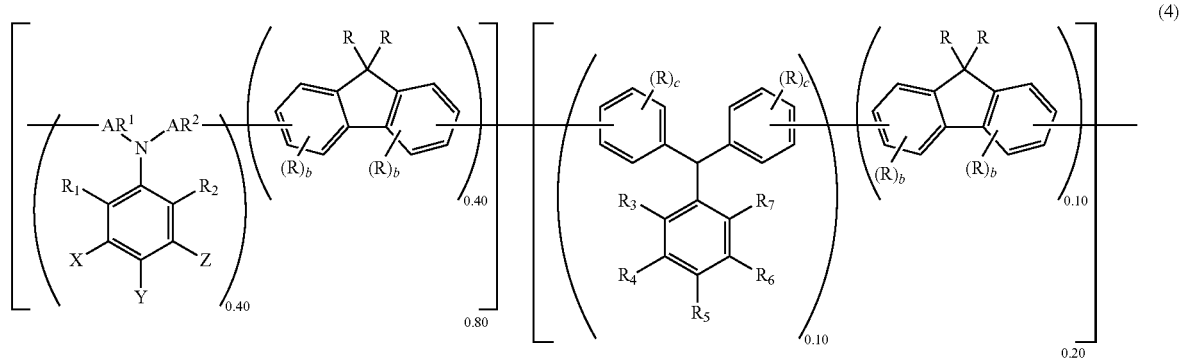
(4)

However, an intermediate for introducing the structural unit A and the structural unit C is a halogenated product, whereas an intermediate for introducing the structural unit B is a borate-esterified product. Alternatively, an intermediate for introducing the structural unit A and the structural unit C is a borate-esterified product, where as an intermediate for introducing the structural unit B is a halogenated product. That is, the molar ratios of the halogenated product and the borate-esterified product need to be equal to each other.

Meanwhile, a bipolymer that contains 50 mol % of the structural unit A represented by the general formula (1) and 50 mol % of the structural unit B represented by the formula (2a) for improving the solubility in an organic solvent is represented by the following general formula (5).

(Chem. 6)

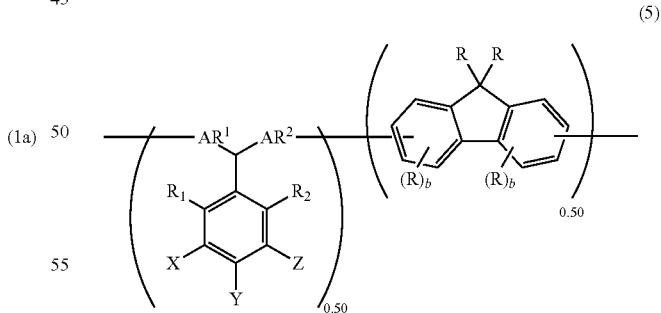
(5)

However, an intermediate for introducing the structural unit A is a halogenated product, whereas an intermediate for introducing the structural unit B is a borate-esterified product. Alternatively, an intermediate for introducing the structural unit A is a borate-esterified product, whereas an intermediate for introducing the structural unit B is a halogenated product. Similarly to the formula (4), the molar ratios of the halogenated product and the borate-esterified product are equal to each other.

A thin film having properties such as excellent hole injection property, an excellent hole transport property, and excellent electron blocking performance can be formed by dissolving the above-mentioned high-molecular-weight compound according to the present invention in an aromatic organic solvent such as benzene, toluene, xylene, and anisole to prepare a coating liquid, coating this coating liquid on a predetermined base material, and heating and drying the coating liquid. Such a thin film has favorable heat resistance and favorable adhesion to other layers.

For example, the high-molecular-weight compound described above can be used as a constituent material of a hole injection layer and/or a hole transport layer of an organic EL device. The hole injection layer or the hole transport layer formed of such a high-molecular-weight compound has a higher hole injection property, a large mobility of holes, and high electron blocking performance as compared with those formed of the existing materials, is capable of confining excitons generated in the light-emitting layer, improves the probability of recombination of holes and electrons, is capable of achieving high light emission efficiency, and is capable of realizing the advantage that a drive voltage is reduced and the durability of an organic EL device is improved.

Further, it goes without saying that the high-molecular-weight compound according to the present invention having an electric property as described above can be suitably used for forming an electron blocking layer or a light-emitting layer.

<Organic EL Device>

Figure 22:
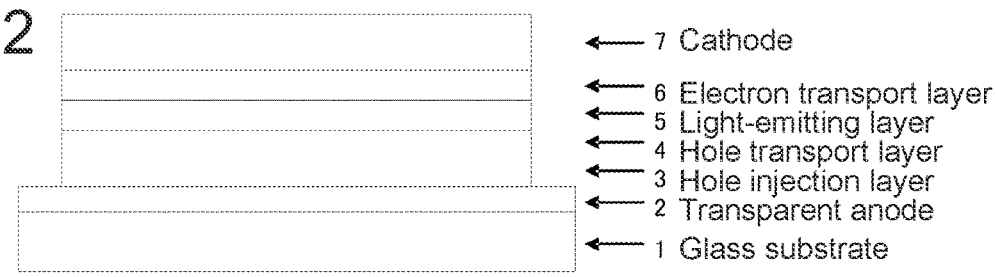
FIG. 22 is a diagram showing an example of a layer configuration of an organic EL device according to the present invention.

An organic EL device that includes an organic layer formed using the above-mentioned high-molecular-weight compound according to the present invention has, for example, a structure shown in FIG. 22. That is, on a glass substrate 1 (e.g., a transparent resin substrate, only needs to be a transparent substrate), a transparent anode 2, a hole injection layer 3, a hole transport layer 4, a light-emitting layer 5, an electron transport layer 6, and a cathode 7 are provided.

It goes without saying that the organic EL device to which the high-molecular-weight compound according to the present invention is applied is not limited to the layer structure described above, and a hole blocking layer may be provided between the light-emitting layer 5 and the electron transport layer 6. Further, an electron blocking layer or the like may be provided between the hole transport layer 4 and the light-emitting layer 5. Further, an electron injection layer may be provided between the cathode 7 and the electron transport layer 6. Further, some layers may be omitted. For example, a simple layer structure in which the anode 2, the hole transport layer 4, the light-emitting layer 5, the electron transport layer 6, and the cathode 7 are provided on the substrate 1 may be used. Further, a two-layer structure in which layers having the same function are stacked may be used.

The high-molecular-weight compound according to the present invention is suitably used as a material for forming the organic layer above-mentioned (e.g., the hole injection layer 3, the hole transport layer 4, the light-emitting layer 5, or an electron blocking layer (not shown)) provided between the anode 2 and the cathode 7 by utilizing the properties such as the hole injection property and the hole transport property.

In the organic EL device described above, the transparent anode 2 may be formed of an electrode material known per se, and is formed by depositing an electrode material having a high work function such as ITO and gold on the substrate 1 (transparent substrate such as a glass substrate).

Further, the hole injection layer 3 provided on the transparent anode 2 can be formed using a coating liquid obtained by dissolving the high-molecular-weight compound according to the present invention in an aromatic organic solvent such as toluene, xylene, and anisole. That is, the hole injection layer 3 can be formed by coating this coating liquid on the transparent anode 2 by spin-coating, ink-jet, or the like.

Further, it can also be formed by using the known material, e.g., the following materials without using the high-molecular-weight compound according to the present invention.

A porphyrin compound typified by copper phthalocyanine;
a starburst triphenylamine derivative;
arylamine (e.g., a triphenylamine trimer and tetramer) having a structure linked with a single bond or a divalent group containing no heteroatom;
an acceptor heterocyclic ring compound such as hexacyanoazatriphenylene; and
a coating type polymer material such as poly(3,4-ethylenedioxythiophene) (PEDOT) and poly(styrenesulfonate) (PSS).

The deposition of a layer (thin film) using such a material can be performed by coating by a vapor deposition method, a spin coat method, an ink jet method, or the like. The same applies to other layers, and the deposition is performed by a vapor deposition method or a coating method in accordance with the type of the film forming material.

Also the hole transport layer 4 provided on the hole injection layer 3 described above can be formed by coating using the high-molecular-weight compound according to the present invention by spin-coating, ink-jet, or the like, similarly to the hole injection layer 3.

Further, the hole transport layer 4 can also be formed using the known hole transport material. Typical examples of such a hole transport material are as follows.

A benzidine derivative such as
N,N'-diphenyl-N,N'-di(m-tolyl)benzidine (hereinafter, abbreviated as TPD);
N,N'-diphenyl-N,N'-di(α-naphthyl)benzidine (hereinafter, abbreviated as NPD); and
N,N,N',N'-tetrabiphenylylbenzidine; an amine derivative such as
1,1-bis[4-(di-4-tolylamino)phenyl]cyclohexane (hereinafter, abbreviated as TAPC); and
various triphenylamine trimer and tetramer; and
a coating type polymer material used also for a hole injection layer.

The above-mentioned compounds of a hole transport layer, including the high-molecular-weight compound according to the present invention, may each be deposited alone, but two or more of them may be mixed and deposited. Further, a plurality of layers may be formed using one or more of the compounds described above, and a multilayer film obtained by stacking such layers may be used as a hole transport layer.

Further, a layer serving as both the hole injection layer 3 and the hole transport layer 4 may be formed, and such a hole injection/transport layer can be formed by coating using a polymer material such as PEDOT.

Note that in the hole transport layer 4 (in the hole injection layer 3 similarly), those obtained by P-doping the material commonly used for the layer with trisbromophenylamine hexachloroantimony, a radialene derivative (see, for example, WO2014/009310), or the like can be used. Further, the hole transport layer 4 (or the hole injection layer 3) can be formed using a polymer compound having a TPD basic skeleton, or the like.

Further, an electron blocking layer (that can be provided between the hole transport layer 4 and the light-emitting layer 5) (not shown) may be formed using a known electron blocking compound having an electron blocking effect, such as a carbazole derivative, a compound having a triphenylsilyl group and a triarylamine structure, or the like. Specific examples of the carbazole derivative and the compound having a triarylamine structure are as follows.

Examples of the carbazole derivative:
4,4',4''-tri(N-carbazolyl) triphenylamine (hereinafter, abbreviated as TCTA);
9,9-bis[4-(carbazol-9-yl)phenyl]fluorene;
1,3-bis(carbazol-9-yl)benzene (hereinafter, abbreviated as mCP); and
2,2-bis[4-(carbazole-9-yl)phenyl]adamantane (hereinafter, abbreviated as Ad-Cz).

Examples of the compound having a triarylamine structure:
9-[4-(carbazol-9-yl)phenyl]-9-[4-(triphenylsilyl)phenyl]-9H-fluorene.

An electron blocking layer is formed by using one of the known electron blocking materials described above alone or two or more of them. However, a plurality of layer may be formed using one or more of these electron blocking materials, and a multilayer film obtained by stacking such layers may be used as an electron blocking layer.

The light-emitting layer 5 of the organic EL device can be used using not only a metal complex of a quinolinol derivative such as Alq$_3$ but also various metal complexes such as zinc, beryllium, and aluminum, and a light-emitting material such as an anthracene derivative, a bis-styrylbenzene derivative, a pyrene derivative, an oxazole derivative, and a polyparaphenylene vinylene derivative.

Further, the light-emitting layer 5 may be formed of a host material and a dopant material.

As the host material in this case, not only the light-emitting material described above but also a thiazole derivative, a benzimidazole derivative, a polydialkylfluorene derivative, and the like can be used. Further, the above-mentioned high-molecular-weight compound according to the present invention may be used.

As the dopant material, quinacridone, coumarin, rubrene, perylene, and derivatives thereof, a benzopyran derivative, a rhodamine derivative, an aminostyryl derivative, and the like can be used.

Such a light-emitting layer 5 may also have a single layer configuration using one or more of the light-emitting materials or a multilayer structure obtained by stacking a plurality of layers.

Further, a phosphorescent light-emitting material may be used as a light-emitting material to form the light-emitting layer 5.

As the phosphorescent light-emitting material, a phosphorescent emitter of a metal complex such as iridium and platinum can be used. For example, a green phosphorescent emitter such as Ir(ppy)$_3$, a blue phosphorescent emitter such as FIrpic and FIr6, or a red phosphorescent emitter such as Btp$_2$Ir(acac) can be used. A hole injection/transport host material or an electron transport host material is doped with these phosphorescent light-emitting materials.

As the hole injection/transport host material, a carbazole derivative such as 4,4'-di (N-carbazolyl) biphenyl (hereinafter, abbreviated as CBP), TCTA, and mCP can be used, and the high-molecular-weight compound according to the present invention may be used.

Further, as the electron transport host material, p-bis(triphenylsilyl)benzene (hereinafter, abbreviated as UGH2), 2,2',2''-(1,3,5-phenylene)-tris(1-phenyl-1H-benzimidazole) (hereinafter, abbreviate as TPBI), or the like can be used.

Note that it is favorable to perform the doping of the host material with the phosphorescent light-emitting material by co-deposition within the range of 1 to 30 weight percent with respect to the whole light-emitting layer in order to avoid concentration quenching.

Further, as the light-emitting material, a material that emits delayed fluorescence such as a CDCB derivative including PIC-TRZ, CC2TA, PXZ-TRZ, and 4CzIPN may be used (see Appl.Phys.Let., 98, 083302(2011)).

By causing the high-molecular-weight compound according to the present invention to carry a fluorescent emitter, a phosphorescent emitter, or a material that emits delayed fluorescence that are called dopants to form the light-emitting layer 5, a drive voltage is reduced and an organic EL device having improved light emission efficiency can be achieved.

A hole blocking layer (not shown) provided between the light-emitting layer 5 and the electron transport layer 6 can be used using a compound having a hole blocking effect known per se.

Examples of such a known compound having a hole blocking effect are as follows.

A phenanthroline derivative such as bathocuproine (hereinafter, abbreviated as BCP);
a metal complex of a quinolinol derivative such as aluminum(III)bis(2-methyl-8-quinolinate)-4-phenylphenolate (hereinafter, abbreviated as BAlq);
various rare earth complexes;
a triazole derivative;
a triazine derivative; and
an oxadiazole derivative.

These materials may be used to form the electron transport layer 6 described below and may be used as such a hole blocking layer and the electron transport layer 6.

Such a hole blocking layer may have a single layer or a multilayer stacked structure, and the respective layers are deposited using one or more of the compounds having the above-mentioned hole blocking effect.

The electron transport layer 6 can be formed using not only an electron transport compound known per se but also a metal complex of a quinolinol derivative including Alq$_3$ and BAlq, various metal complexes, a pyridine derivative, a pyrimidine derivative, a triazole derivative, a triazine derivative, an oxadiazole derivative, a thiadiazole derivative, a carbodiimide derivative, a quinoxaline derivative, a phenanthroline derivative, a silole derivative, a benzimidazole derivative, and the like. Also this electron transport layer 6 may have a single layer or a multilayer stacked structure, and the respective layers are deposited using one or more of the above-mentioned electron transport compounds.

Further, also an electron injection layer (not shown) provided as necessary can be formed using those known per se, e.g., an alkali metal salt such as lithium fluoride and cesium fluoride, an alkaline earth metal salt such as magnesium fluoride, metal oxide such as aluminum oxide, or an organic metal complex such as lithium quinoline.

In the cathode 7 of the organic EL device, an electrode material having a low work function such as aluminum, or an alloy having a lower work function such as a magnesium silver alloy, a magnesium indium alloy, and an aluminum magnesium alloy is used as the electrode material.

In the present invention, a high-molecular-weight compound that includes the above-mentioned substituted triarylamine structural unit represented by the general formula (1) is used to form at least any one of the hole injection layer 3, the hole transport layer 4, the light-emitting layer 5, and an electron blocking layer (not shown), and thus, an organic EL device having high light emission efficiency, high power efficiency, a low practical drive voltage, a low light emission start voltage, and an extremely excellent durability can be achieved. In particular, this organic EL device has a reduced drive voltage, improved current tolerance, the improved maximum light-emission luminance while having high light emission efficiency.

EXAMPLE

Hereinafter, the present invention will be described by way of the following Experimental Examples.

Note that in the following description, the structural unit represented by the general formula (1) of the high-molecular-weight compound according to the present invention, the structural unit that is represented by the formula (2) and introduced for enhancing the solubility in an organic solvent, and the triarylamine structural unit represented by the formula (3) are respectively shown as the "structural unit A", the "structural unit B", and the "structural unit C".

Further, the purification of the synthesized compound was performed by purification by column chromatography and a crystallization method using a solvent. The identification of the compound was performed by NMR analysis.

See WO2018/168667 for more information on the synthesis of the intermediate for producing the high-molecular-weight compound according to the present invention.

Example 1

Synthesis of a High-Molecular-Weight Compound I

The following components were added to a reaction vessel purged with nitrogen and a nitrogen gas was bubbled for 30 minutes.
2,7-bis(4,4,5,5-tetramethyl-1,3,2-dioxaborolan-2-yl)-9,9-di-n-octylfluorene: 6.5 g
N,N-bis(4-bromophenyl)-4-(2-naphthalenyl)-[1,1':2',1''-terphenyl]-4'-amine: 5.5 g
4,4'-dibromotriphenylamine: 0.8 g
Tripotassium phosphate: 9.0 g
Toluene:16 ml
Water: 9 ml
1,4-dioxane: 48 ml Subsequently, 2.0 mg of palladium acetate (II) and 15.1 mg of tri-o-tolylphosphine were added thereto, and the mixture was heated and stirred at 80° C. for 12.5 hours.

After that, 22 mg of phenylboronic acid was added thereto, the mixture was stirred for 1 hour, and then, 0.3 g of bromobenzene was added thereto and the mixture was stirred for 1 hour.

100 ml of toluene and 100 ml of a 5 wt % sodium N,N-diethyldithiocarbamate aqueous solution were added thereto, and the mixture was heated and stirred at reflux for 2 hours.

After cooling the mixture to room temperature, an organic layer was collected by performing a liquid separation operation and was cleaned with saturated saline three times. The organic layer was dehydrated with anhydrous magnesium sulfate and then concentrated under reduced pressure to obtain a crude polymer. The crude polymer was dissolved in toluene, silica gel was added thereto to perform adsorption purification, followed by filtration to remove the silica gel. The obtained filtrate was concentrated under reduced pressure, 200 ml of toluene was added to the dried matter to dissolve, the mixture was added dropwise into 400 ml of n-hexane, and the obtained precipitate was collected by filtration. This procedure was repeated three times, and the collected precipitate was dried to obtain 7.8 g (yield of 90%) of a polymer compound I.

Figure 23:
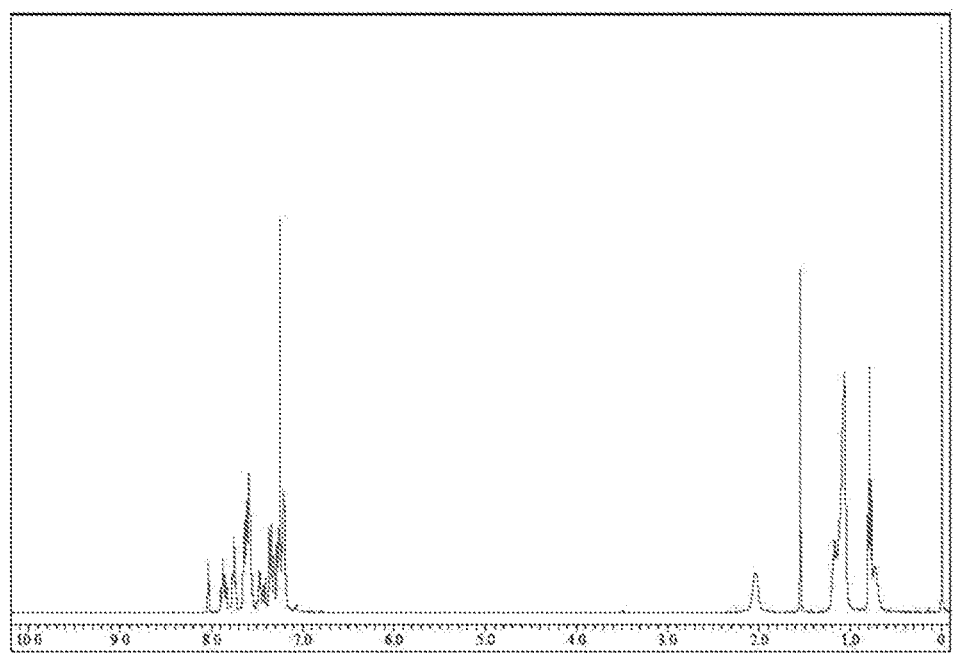
FIG. 23 is a $^1$H-NMR chart diagram of a high-molecular-weight compound according to the present invention (compound I) synthesized in Example 1.

NMR measurement was performed on the obtained polymer compound I. $^1$H-NMR measurement results were shown in FIG. 23.

Further, the average molecular weight measured by GPC, dispersity, and the chemical composition of the high-molecular-weight compound were as follows.
Number average molecular weight Mn (in terms of polystyrene): 44,000
Weight average molecular weight Mw (in terms of polystyrene): 89,000
Dispersity (Mw/Mn): 2.0
Chemical composition: the structural unit A: 40%/the structural unit B: 50%/the structural unit C: 10%

(Chem. 7)

(High-molecular-weight compound I)

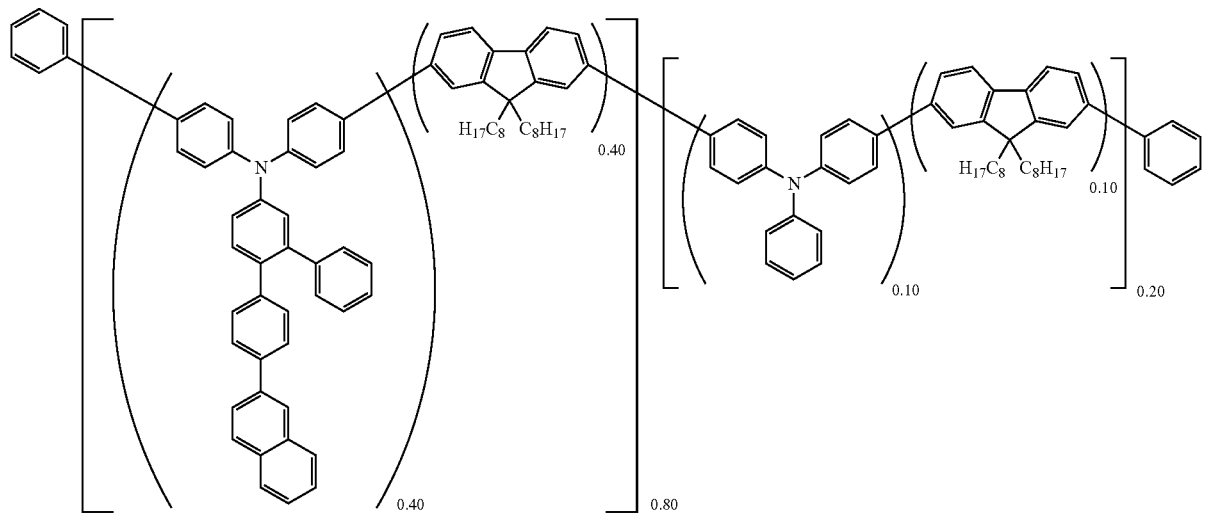

As understood from the chemical composition described above, this polymer compound I contained 40 mol % of the structural unit A represented by the general formula (1), 50 mol % of the structural unit B represented by the formula (2) for improving the solubility in an organic solvent, and 10 mol % of the triarylamine structural unit C represented by the formula (3).

Example 2

Synthesis of a High-Molecular-Weight Compound II

The following components were added to a reaction vessel purged with nitrogen and a nitrogen gas was bubbled for 30 minutes.
2,7-bis(4,4,5,5-tetramethyl-1,3,2-dioxaborolan-2-yl)-9,9-di-n-octylfluorene: 6.9 g
N,N-bis(4-bromophenyl)-4-(2-naphthalenyl)-[1,1':2',1"-terphenyl]-4'-amine: 6.5 g
Tripotassium phosphate: 9.0 g
Toluene: 16 ml
Water: 9 ml
1,4-dioxane: 48 ml Subsequently, 1.9 mg of palladium acetate (II) and 15.1 mg of tri-o-tolylphosphine were added thereto, and the mixture was heated and stirred 85° C. for 14 hours.

After that, 22 mg of phenylboronic acid was added thereto, the mixture was stirred for 1 hour, and then, 0.3 g of bromobenzene was added thereto and the mixture was stirred for 1 hour.

100 ml of toluene and 100 ml of a 5 wt % sodium N,N-diethyldithiocarbamate aqueous solution were added thereto, and the mixture was heated and stirred at reflux for 1 hour.

After cooling the mixture to room temperature, an organic layer was collected by performing a liquid separation operation and was cleaned with saturated saline three times. The organic layer was dehydrated with anhydrous sodium sulfate and then concentrated under reduced pressure to obtain a crude polymer. The crude polymer was dissolved in toluene, silica gel was added thereto to perform adsorption purification, followed by filtration to remove the silica gel. The obtained filtrate was concentrated under reduced pressure, 200 ml of toluene was added to the dried matter to dissolve, the mixture was added dropwise into 400 ml of n-hexane, and the obtained precipitate was collected by filtration. This procedures was repeated three times, and the obtained precipitate was dried to obtain 8.7 g (yield of 92%) of a polymer compound II.

Figure 24:
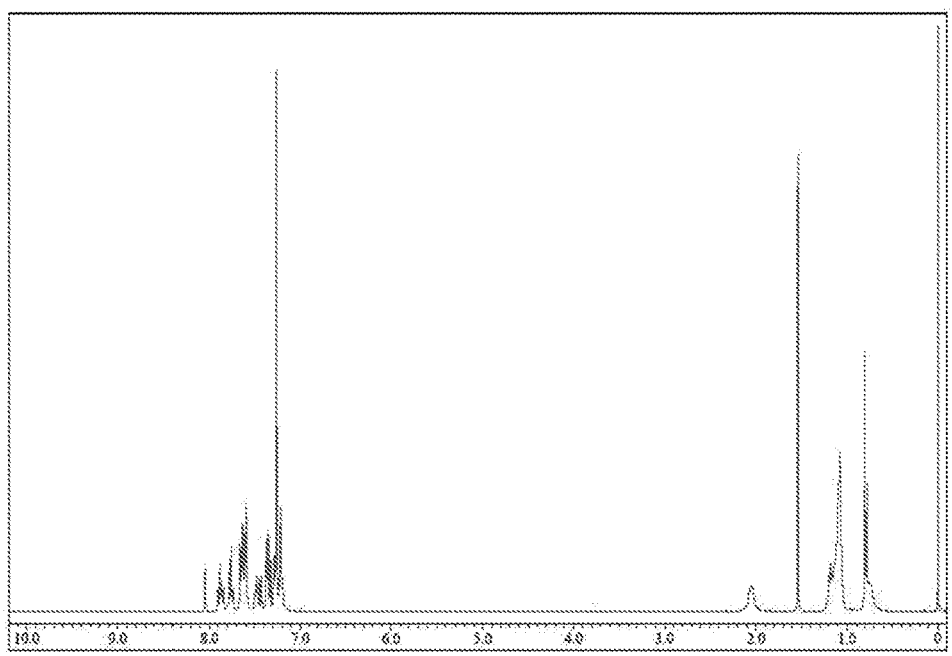
FIG. 24 is a $^1$H-NMR chart diagram of a high-molecular-weight compound according to the present invention (compound II) synthesized in Example 2.

NMR measurement was performed on the obtained polymer compound II. $^1$H-NMR measurement results were shown in FIG. 24.

Further, the average molecular weight measured by GPC, dispersity, and the chemical composition of the high-molecular-weight compound were as follows.
Number average molecular weight Mn (in terms of polystyrene): 38,000
Weight average molecular weight Mw (in terms of polystyrene): 84,000
Dispersity (Mw/Mn): 2.2
Chemical composition: the structural unit A: 52%/the structural unit B: 48%

(Chem. 8)

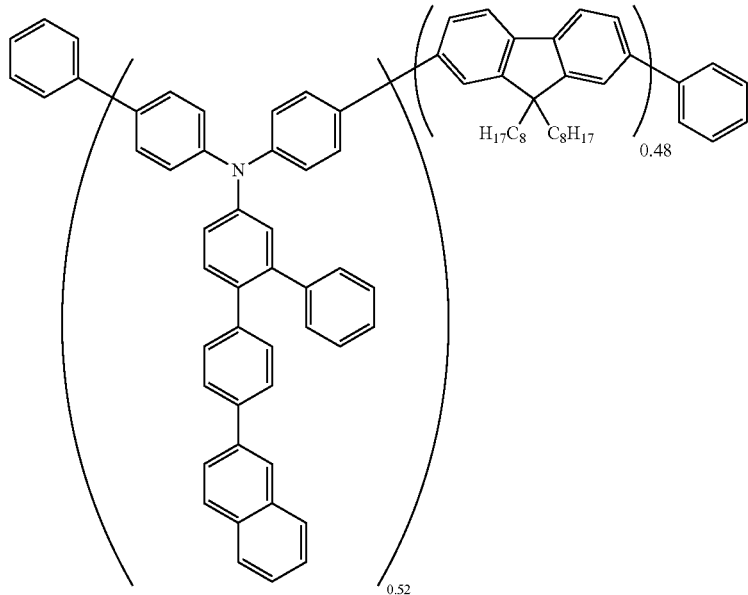

(High-molecular-weight compound II)

Example 3

Synthesis of a High-Molecular-Weight Compound III

The following components were added to a reaction vessel purged with nitrogen and a nitrogen gas was bubbled for 30 minutes.

N,N-bis[4-(4,4,5,5-tetramethyl-1,3,2-dioxaborolan-2-yl)phenyl]-9,9-dioctyl-9H-fluorene-2-amine: 6.5 g
N,N-bis(4-bromophenyl)-4-(2-naphthalenyl)-[1,1':2',1''-terphenyl]-4'-amine: 5.5 g
Tripotassium phosphate: 7.2 g
Toluene: 16 ml
Water: 9 ml
1,4-dioxane: 48 ml Subsequently, 1.5 mg of palladium acetate (II) and 11.9 mg of tri-o-tolylphosphine were added thereto, and the mixture was heated and stirred at 83° C. for 11 hours.

(Chem. 9)

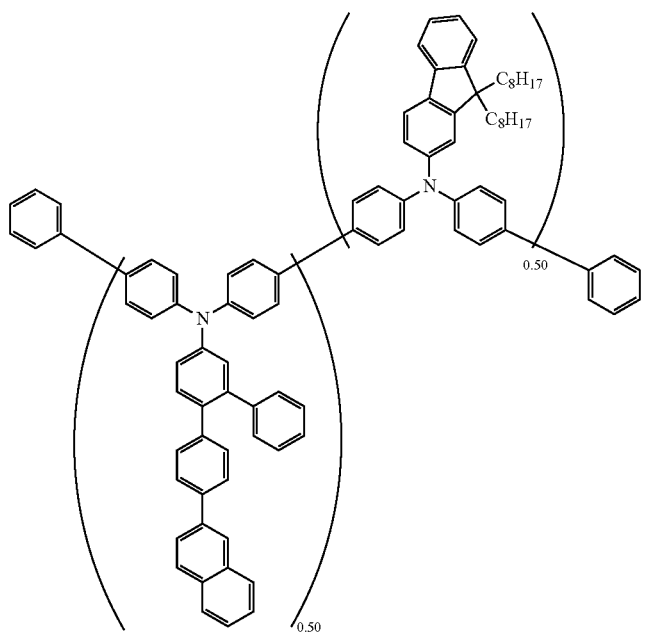

(High-molecular-weight compound III)

After that, 22 mg of phenylboronic acid was added thereto, the mixture was stirred for 1 hour, and then, 0.3 g of bromobenzene was added thereto and the mixture was stirred for 1 hour.

100 ml of toluene and 100 ml of a 5 wt % sodium N,N-diethyldithiocarbamate aqueous solution were added thereto, and the mixture was heated and stirred for 1 hour.

After cooling the mixture to room temperature, an organic layer was collected by performing a liquid separation operation and was cleaned with saturated saline three times. The organic layer was dehydrated with anhydrous magnesium sulfate and then concentrated under reduced pressure to obtain a crude polymer. The crude polymer was dissolved in toluene, silica gel was added thereto to perform adsorption purification, followed by filtration to remove the silica gel. The obtained filtrate was concentrated under reduced pressure, 200 ml of toluene was added to the dried matter to dissolve, the mixture was added dropwise into 400 ml of n-hexane, and the obtained precipitate was collected by filtration. This procedures was repeated three times, the obtained precipitate was dried to obtain 7.3 g (yield of 82%) of a polymer compound III.

Figure 25:
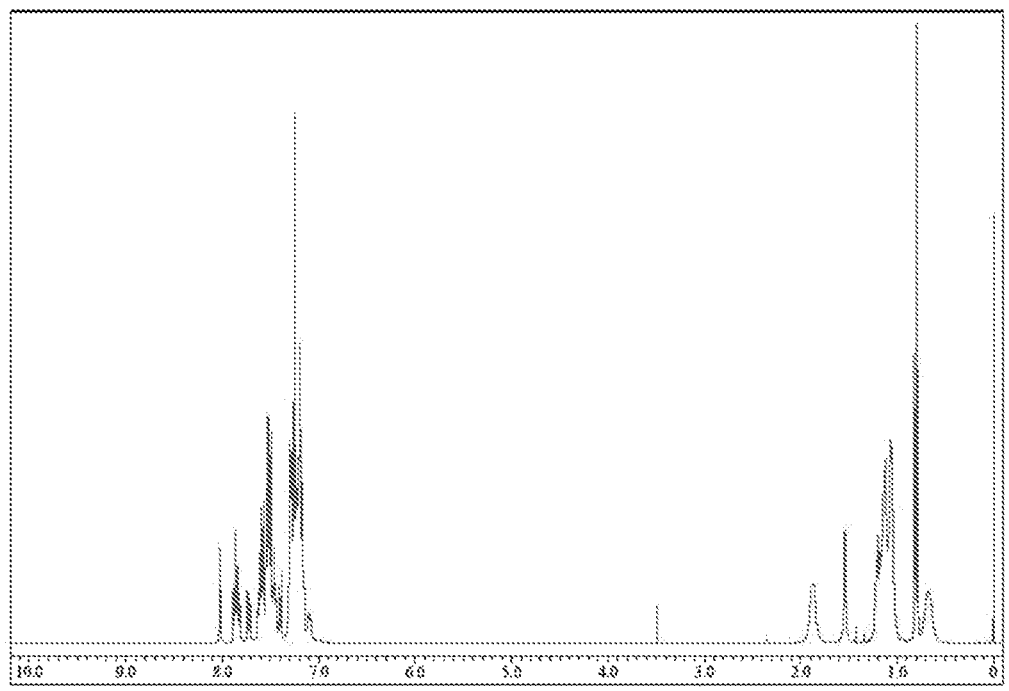
FIG. 25 is a $^1$H-NMR chart diagram of a high-molecular-weight compound according to the present invention (compound III) synthesized in Example 3.

NMR measurement was performed on the obtained polymer compound III. $^1$H-NMR measurement results were shown in FIG. 25.

Further, the average molecular weight measured by GPC, dispersity, and the chemical composition of the high-molecular-weight compound were as follows.

Number average molecular weight Mn (in terms of polystyrene): 76,000
Weight average molecular weight Mw (in terms of polystyrene): 210,000
Dispersity (Mw/Mn): 2.8
Chemical composition: the structural unit A: 50%/the structural unit B: 50%

Example 4

Coating films each having a film thickness of 80 nm were prepared on ITO substrates using the high-molecular-weight compounds I to III respectively synthesized in Examples 1 to 3, and the work functions thereof were measured by an ionization potential measuring device (PYS-202 manufactured by Sumitomo Heavy Industries, Ltd.). The results were as follows.

Work Function
High-molecular-weight compound I (polymer) 5.60 eV
High-molecular-weight compound II (polymer) 5.61 eV
High-molecular-weight compound III (polymer) 5.41 eV It can be seen that each of the high-molecular-weight compounds I to III according to the present invention exhibits a suitable energy level as compared with the work function of a common hole transport material such as NPD and TPD, i.e., 5.40 eV, and has favorable hole transport capacity.

Example 5

Figure 21:
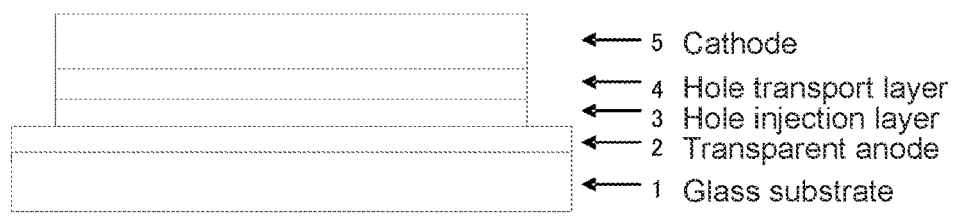
FIG. 21 is a diagram showing an example of a layer configuration of a hole-only device according to the present invention.

Preparation and Evaluation of a Hole-Only Device;

A hole-only device having the layer structure shown in FIG. 21 was prepared by the following way. The hole-only device is a device that does not include a light-emitting layer and causes only holes to flow unlike an organic EL device. Note that toluene was used to prepare the coating liquid used for forming the hole transport layer 4.

Specifically, the glass substrate 1 on which ITO having a film thickness of 50 nm was deposited was cleaned with an organic solvent, and then the ITO surface was cleaned by UV/ozone treatment.

PEDOT/PSS (manufactured by HERAEUS) was deposited by spin-coating to have a thickness of 50 nm in the atmosphere so as to cover the transparent anode 2 (ITO) provided on this glass substrate 1, and dried on a hot plate at 200° C. for 10 minutes to form the hole injection layer 3.

1.2 weight % of the high-molecular-weight compound I obtained in Example 1 was dissolved in toluene to prepare a coating liquid. The substrate on which the hole injection layer 3 was formed as described above was transferred into a glovebox substituted with dry nitrogen, and dried on a hot plate at 230° C. for 10 minutes, and then, a coating layer (Chem. 10)

having a thickness of 50 nm was formed using the coating liquid described above on the hole injection layer 3 and dried on a hot plate at 200° C. for 10 minutes to form the hole transport layer 4.

The substrate on which the hole transport layer 4 was formed as described above was mounted in a vacuum deposition machine and the pressure was reduced to 0.001 Pa or less. Finally, aluminum was deposited to have a film thickness of 100 nm to form the cathode 5.

As described above the glass substrate on which the transparent anode 2, the hole injection layer 3, the hole transport layer 4, and the cathode 5 were formed was transferred into a glovebox substituted with dry nitrogen, and another glass substrate for sealing was attached thereto using a UV-curing resin to obtain a hole-only device. Current density-voltage properties of the prepared hole-only device when a direct current voltage was applied were measured in the atmosphere at room temperature. The measurement results described above were shown in Table 1.

Example 6

A hole-only device was prepared in the same way as that in Example 5 except that a coating film having a thickness of 50 nm was formed by spin-coating using the coating liquid of the high-molecular-weight compound I and heated on a hot plate at 220° C. for 30 minutes to form the hole transport layer 4. The current density-voltage properties of this hole-only device were evaluated in the same way as that in Example 5, and the results were shown in table 1.

Comparative Example 1

A hole-only device was prepared in the same way as that in Example 5 except that the hole transport layer 4 was formed using, instead of the high-molecular-weight compound I, a coating liquid prepared by dissolving 1.2 weight % of HTM-1 including the crosslinker described below (see WO2018/168667.) in toluene.

(HTM-1)

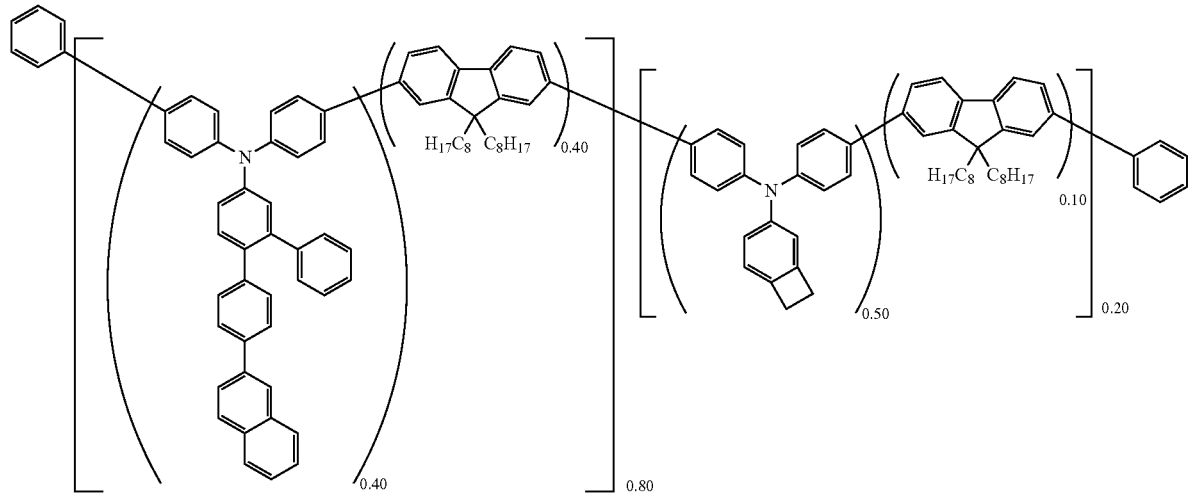

The current density-voltage properties of this hole-only device were evaluated in the same way as that in Example 5, and the results were shown in table 1.

Comparative Example 2

A hole-only device was prepared in the same way as that in Example 5 except that a coating film having a thickness of 50 nm was formed by spin-coating using the coating liquid of HTM-1 instead of the high-molecular-weight compound I and heated on a hot plate at 220° C. for 30 minutes to form the hole transport layer 4. The current density-voltage properties of this hole-only device were evaluated in the same way as that in Example 5, and the results were shown in table 1.

Comparative Example 3

A hole-only device was prepared in the same way as that in Example 5 except that the hole transport layer 4 was formed using, instead of the high-molecular-weight compound I, the coating liquid prepared by dissolving 1.2 weight % of the TFB (hole transport polymer) described below in toluene.

(Chem. 11)

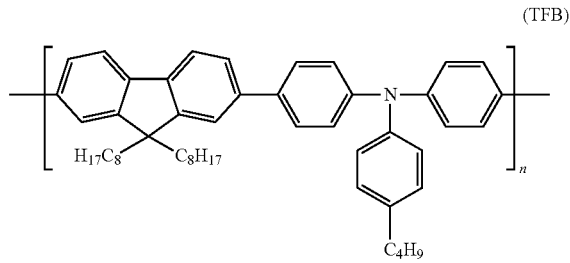

(TFB)

Poly [(9,9-dioctylfluorenyl-2,7-diyl)-co-(4,4'-(N-(4-sec-butylphenyl))diphenyl amine] (manufactured by American Dye Source, Hole Transport Polymer ADS259BE)

The current density-voltage properties of this hole-only device were evaluated in the same way as that in Example 5, and the results were shown in table 1.

Comparative Example 4

A hole-only device was prepared in the same way as that in Example 5 except that a coating film having a thickness of 50 nm was formed by spin-coating using the coating liquid of TFB instead of the high-molecular-weight compound I and heated on a hot plate at 220° C. for 30 minutes to form the hole transport layer 4. The current density-voltage properties of this hole-only device were evaluated in the same way as that in Example 5, and the results were shown in table 1.

Example 5 as compared with 1.96V and 3.38V of the hole-only devices according to Comparative Example 1 and Comparative Example 3. Further, in the hole-only device including the hole transport layer 4 prepared under the heat condition of 220° C. and 30 minutes, the drive voltage when a current having the current density of 10 mA/cm$^2$ is caused to flow was low, i.e., 1.86 V in the hole-only device according to Example 6 as compared with 2.28V and 4.13V of the hole-only devices according to Comparative Example 2 and Comparative Example 4.

Further, as shown in Table 1, in the hole-only devices according to Comparative Example 1 and Comparative Example 2 in which HTM-1 is used for the hole transport layer 4, the difference of the drive voltage when a current having the current density of 10 mA/cm$^2$ is caused to flow was 0.32 V. Further, in the hole-only devices according to Comparative Example 3 and Comparative Example 4 in which TFB is used for the hole transport layer 4, the difference of the drive voltage when a current having the current density of 10 mA/cm$^2$ is caused to flow was 0.75 V.

Meanwhile, in the hole-only devices according to Example 5 and Example 6 in which the high-molecular-weight compound I is used for the hole transport layer 4, the difference of the drive voltage when a current having the current density of 10 mA/cm$^2$ is caused to flow was 0.10 V, and the increase in the drive voltage was suppressed in the heat condition of high temperature/long time as compared with HTM-1 and TFB.

As described above, it was found that a hole-only device including an organic layer (dissolved in toluene and coated) formed using the high-molecular-weight compound according to the present invention could achieve a low voltage property as compared with the hole-only device using the existing material. That is, it was found that the high-molecular-weight compound according to the present invention had a high hole transport property as compared with the existing material. Further, it was found that the high-molecular-weight compound according to the present invention suppresses the increase in the drive voltage even in the hole-only device prepared under the heat condition of high temperature/long time as compared with the existing material. That is, it was found that the high-molecular-weight compound according to the present invention had high heat resistance as compared with the existing material.

TABLE 1

|  | Hole transport layer | Used solvent | Heat condition | Voltage[V] (@ 10 mA/cm$^2$) | Voltage difference $\Delta$ [V] |
|---|---|---|---|---|---|
| Example 5 | High-molecular-weight compound I | Toluene | 200° C., 10 min | 1.76 | 0.10 |
| Example 6 | High-molecular-weight compound I |  | 220° C., 30 min | 1.86 |  |
| Comparative Example 1 | HTM-1 |  | 200° C., 10 min | 1.96 | 0.32 |
| Comparative Example 2 | HTM-1 |  | 220° C., 30 min | 2.28 |  |
| Comparative Example 3 | TFB |  | 200° C., 10 min | 3.38 | 0.75 |
| Comparative Example 4 | TFB |  | 220° C., 30 min | 4.13 |  |

As shown in Table 1, in the hole-only device including the hole transport layer 4 prepared under the heat condition of 200° C. and 10 minutes, the drive voltage when a current having the current density of 10 mA/cm$^2$ is caused to flow was low, i.e., 1.76 V in the hole-only device according to Example 7

Preparation and Evaluation of a Hole-Only Device
The hole-only device having the layer structure shown in FIG. 21 was prepared by the following way.

Note that cyclohexylbenzene was used to prepare a coating liquid used for forming the hole transport layer 4.

Specifically, the glass substrate 1 on which ITO having a film thickness of 50 nm was deposited was cleaned with an organic solvent, and then the ITO surface was cleaned by UV/ozone treatment.

PEDOT/PSS (manufactured by HERAEUS) was deposited by spin-coating to have a thickness of 50 nm in the atmosphere so as to cover the transparent anode 2 (ITO) provided on this glass substrate 1, and dried on a hot plate at 200° C. for 10 minutes to form the hole injection layer 3.

2.5 weight % of the high-molecular-weight compound I obtained in Example 1 is dissolved in cyclohexylbenzene to prepare a coating liquid. The substrate on which the hole injection layer 3 was formed as described above was transferred into a glovebox substituted with dry nitrogen, and dried on a hot plate at 230° C. for 10 minutes, and then, a coating layer having a thickness of 50 nm was formed using the coating liquid described above on the hole injection layer 3 and dried on a hot plate at 200° C. for 10 minutes to form the hole transport layer 4.

The substrate on which the hole transport layer 4 was formed as described above was mounted in a vacuum deposition machine and the pressure was reduced to 0.001 Pa or less. Finally, aluminum was deposited to have a film thickness of 100 nm to form the cathode 5.

As described above, the glass substrate on which the transparent anode 2, the hole injection layer 3, the hole transport layer 4, and the cathode 5 were formed was transferred into a glovebox substituted with dry nitrogen, and another glass substrate for sealing was attached thereto using a UV-curing resin to obtain a hole-only device. Current density-voltage properties of the prepared hole-only device when a direct current voltage was applied were measured in the atmosphere at room temperature. The measurement results described above were shown in Table 2.

Example 8

A hole-only device was prepared in exactly the same way as that in Example 7 except that a coating film having a thickness of 50 nm was formed by spin-coating using the coating liquid of the high-molecular-weight compound I and dried on a hot plate at 230° C. for 30 minutes to form the hole transport layer 4. The current density-voltage properties of this hole-only device were evaluated in the same way as that in Example 7, and the results were shown in Table 2.

Example 9

A hole-only device was prepared in exactly the same way as that in Example 7 except that a coating film having a thickness of 50 nm was formed by spin-coating using the coating liquid of the high-molecular-weight compound II instead of the high-molecular-weight compound I to form the hole transport layer 4. The current density-voltage properties of this hole-only device were evaluated in the same way as that in Example 7, and the results were shown in Table 2.

Example 10

A hole-only device was prepared in exactly the same way as that in Example 7 except that a coating film having a thickness of 50 nm was formed by spin-coating by using the coating liquid of the high-molecular-weight compound II instead of the high-molecular-weight compound I, and dried on a hot plate at 230° C. for 30 minutes to form the hole transport layer 4. The current density-voltage properties of this hole-only device were evaluated in the same way as that in Example 7, and the results were shown in Table 2.

Example 11

A hole-only device was prepared in exactly the same way as that in Example 7 except that a coating film having a thickness of 50 nm was formed by spin-coating using the coating liquid of the high-molecular-weight compound III instead of the high-molecular-weight compound I to form the hole transport layer 4. The current density-voltage properties of this hole-only device were evaluated in the same way as that in Example 7, and the results were shown in Table 2.

Example 12

A hole-only device was prepared in exactly the same way as that in Example 7 except that a coating film having a thickness of 50 nm was formed by spin-coating using the coating liquid of the high-molecular-weight compound III instead of the high-molecular-weight compound I, and dried on a hot plate at 230° C. for 30 minutes to form the hole transport layer 4. The current density-voltage properties of this hole-only device were evaluated in the same way as that in Example 7, and the results were shown in Table 2.

Comparative Example 5

A hole-only device was prepared in exactly the same way as that in Example 7 except that the hole transport layer 4 was formed using, instead of the high-molecular-weight compound I, a coating liquid prepared by dissolving 2.5 weight % of HTM-1 in cyclohexylbenzene. The current density-voltage properties of this hole-only device were evaluated in the same way as that in Example 7, and the results were shown in Table 2.

Comparative Example 6

A hole-only device was prepared in exactly the same way as that in Example 7 except that a coating film having a thickness of 50 nm was formed by spin-coating using the coating liquid of HTM-1 instead of the high-molecular-weight compound I, and dried on a hot plate at 230° C. for 30 minutes to form the hole transport layer 4. The current density-voltage properties of this hole-only device were evaluated in the same way as that in Example 7, and the results were shown in Table 2.

Comparative Example 7

A hole-only device was prepared in exactly the same way as that in Example 7 except that the hole transport layer 4 was formed using a coating liquid prepared by dissolving 2.5 weight % of TFB in cyclohexylbenzene instead of the high-molecular-weight compound I. The current density-voltage properties of this hole-only device were evaluated in the same way as that in Example 7, and the results were shown in Table 2.

Comparative Example 8

A hole-only device was prepared in exactly the same way as that in Example 7 except that a coating film having a thickness of 50 nm was formed by spin-coating using, instead of the high-molecular-weight compound I, a coating liquid of TFB, and dried on a hot plate at 230° C. for 30 minutes to form the hole transport layer 4. The current density-voltage properties of this hole-only device were evaluated in the same way as that in Example 7, and the results were shown in Table 2.

TABLE 2

| | Hole transport layer | Used solvent | Heat condition | Voltage [V] (@ 10 mA/cm$^2$) | Voltage difference $\Delta$ [V] |
|---|---|---|---|---|---|
| Example 7 | High-molecular-weight compound I | Cyclohexyl benzene | 200° C., 10 min | 1.74 | 0.03 |
| Example 8 | High-molecular-weight compound I | | 230° C., 30 min | 1.77 | |
| Example 9 | High-molecular-weight compound II | | 200° C., 10 min | 1.84 | 0.00 |
| Example 10 | High-molecular-weight compound II | | 230° C., 30 min | 1.84 | |
| Example 11 | High-molecular-weight compound III | | 200° C., 10 min | 1.36 | 0.11 |
| Example 12 | High-molecular-weight compound III | | 230° C., 30 min | 1.47 | |
| Comparative Example 5 | HTM-1 | | 200° C., 10 min | 2.01 | 0.38 |
| Comparative Example 6 | HTM-1 | | 230° C., 30 min | 2.39 | |
| Comparative Example 7 | TFB | | 200° C., 10 min | 3.11 | 1.04 |
| Comparative Example 8 | TFB | | 230° C., 30 min | 4.15 | |

As shown in Table 2, in the hole-only device including the hole transport layer 4 prepared under the heat condition of 200° C. and 10 minutes, the drive voltage when a current having the current density of 10 mA/cm$^2$ is caused to flow was low, i.e., 1.74 V, 1.84 V, and 1.36 V in the hole-only devices according to Example 7, Example 9, and Example 11 as compared with 2.01 V and 3.11 V of the hole-only devices according to Comparative Example 5 and Comparative Example 7. Further, in the hole-only device including the hole transport layer 4 prepared under the heat condition of 230° C. and 30 minutes, the drive voltage when a current having the current density of 10 mA/cm$^2$ is caused to flow was low, i.e., 1.77 V, 1.84 V, and 1.47 V in the hole-only devices according to Example 8, Example 10, and Example 12 as compared with 2.39 V and 4.15 V in the hole-only devices according to Comparative Example 6 and Comparative Example 8.

Further, as shown in Table 2, in the hole-only devices according to Comparative Example 5 and Comparative Example 6 in which HTM-1 is used for the hole transport layer 4, the difference of the drive voltage when a current having the current density of 10 mA/cm$^2$ is caused to flow was 0.38 V. Further, in the hole-only device according to Comparative Example 7 and Comparative Example 8 in which TFB is used for the hole transport layer 4, the difference of the drive voltage when a current having the current density of 10 mA/cm$^2$ is caused to flow was 1.04 V.

Meanwhile, the difference of the drive voltage when a current having the current density of 10 mA/cm$^2$ is caused to flow was 0.03 V in the hole-only devices according to Example 7 and Example 8 in which the high-molecular-weight compound I is used for the hole transport layer 4, the difference of the drive voltage when a current having the current density of 10 mA/cm$^2$ is caused to flow was 0.00 V in the hole-only devices according to Example 9 and Example 10 in which the high-molecular-weight compound II was used for the hole transport layer 4, the difference of the drive voltage when a current having the current density of 10 mA/cm$^2$ is caused to flow was 0.11 V in the hole-only devices according to Example 11 and Example 12 in which the high-molecular-weight compound III was used for the hole transport layer 4, and the increase in the drive voltage was suppressed under the heat condition of high temperature/long time as compared with HTM-1 and TFB.

As described above, it was found that a hole-only device including an organic layer (dissolved in cyclohexylbenzene and coated) formed using the high-molecular-weight compound according to the present invention could achieve a low voltage property as compared with the hole-only device using the existing material. That is, it was found that the high-molecular-weight compound according to the present invention had a high hole transport property as compared with the existing material. Further, it was found that the high-molecular-weight compound according to the present invention suppresses the increase in the drive voltage even in the hole-only device prepared under the heat condition of high temperature/long time as compared with the existing material. That is, it was found that the high-molecular-weight compound according to the present invention had high heat resistance as compared with the existing material.

Example 13

Preparation of Evaluation of an Organic EL Device

The organic EL device having the layer structure shown in FIG. 22 was prepared by the following way.

Specifically, the glass substrate 1 on which ITO having a film thickness of 50 nm was deposited was cleaned with an organic solvent, and then the ITO surface was cleaned by UV/ozone treatment. PEDOT/PSS (manufactured by HERAEUS) was deposited by a spin coat method to have a thickness of 50 nm so as to cover the transparent anode 2 (ITO) provided on this glass substrate 1, and dried on a hot plate at 200° C. for 10 minutes to form the hole injection layer 3.

0.6 weight % of the high-molecular-weight compound I obtained in Example 1 was dissolved in toluene to prepare a coating liquid. The substrate on which the hole injection layer 3 was formed as described above was transferred into a glovebox substituted with dry nitrogen, and dried on a hot plate at 230° C. for 10 minutes, and then, a coating layer having a thickness of 25 nm was formed by spin-coating using the coating liquid described above on the hole injection layer 3 and dried on a hot plate at 220° C. for 30 minutes to form the hole transport layer 4.

The substrate on which the hole transport layer 4 was formed as described above was mounted in a vacuum deposition machine and the pressure was reduced to 0.001 Pa or less. The light-emitting layer 5 having a film thickness of 34 nm was formed on the hole transport layer 4 by binary deposition of a blue light-emitting material (EMD-1) and a host material (EMH-1) represented by the following structural formulae. Note that in the binary deposition, the ratio of the deposition rates was set to EMD-1:EMH-1=4:96.

(Chem. 12)

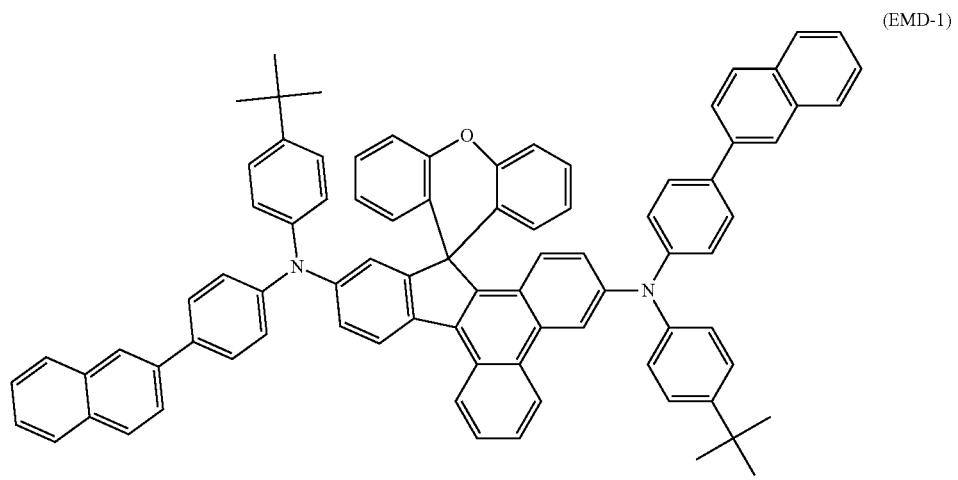

(EMD-1)

(Chem. 13)

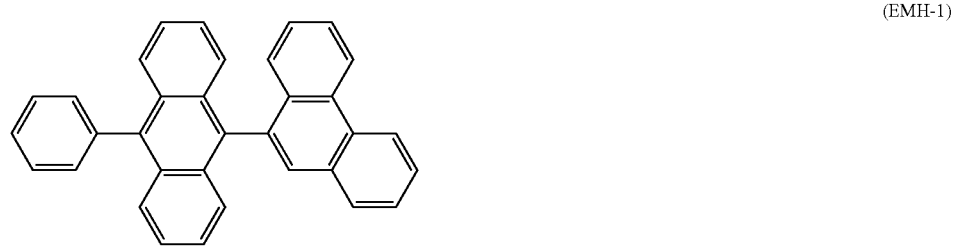

(EMH-1)

As electron transport materials, compounds (ETM-1) and (ETM-2) represented by the following structural formulae were prepared.

(Chem. 14)

(ETM-1)

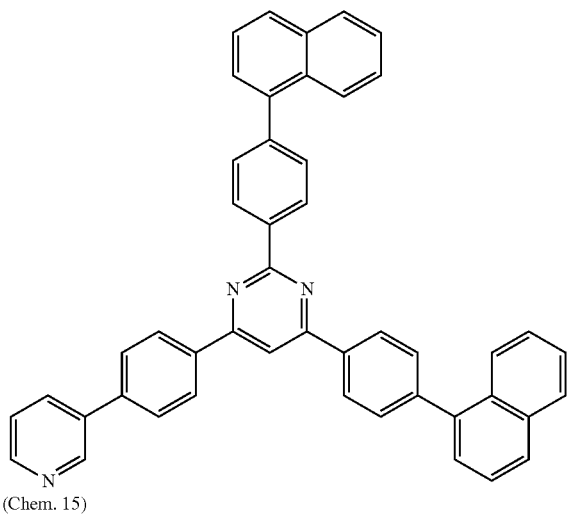

(Chem. 15)

(ETM-2)

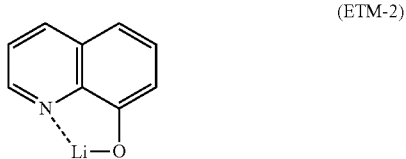

The electron transport layer 6 having a film thickness of 20 nm was formed on the light-emitting layer 5 formed as described above by binary deposition using the electron transport materials (ETM-1) and (ETM-2) described above.

Note that in the binary deposition, the ratio of the deposition rates was set to ETM-1:ETM-2=50:50.

Finally, aluminum was deposited to have a film thickness of 100 nm to form the cathode 7.

As described above, the glass substrate on which the transparent anode 2, the hole injection layer 3, the hole transport layer 4, the light-emitting layer 5, the electron transport layer 6, and the cathode 7 were formed was transferred into a glovebox substituted with dry nitrogen, and another glass substrate for sealing was attached thereto using a UV-curing resin to obtain an organic EL device. The properties of the prepared organic EL device were measured in the atmosphere at room temperature. Further, the light emitting property when a direct current voltage is applied to the prepared organic EL device was measured. The measurement results described above were shown in Table 3.

Example 14

An organic EL device was prepared in exactly the same way as that in Example 13 except that the hole transport layer 4 was formed using, instead of the high-molecular-weight compound I, the coating liquid of the high-molecular-weight compound II. Various properties of this organic EL device were evaluated in the same way as that in Example 13, and the results were shown in Table 3.

Example 15

An organic EL device was prepared in exactly the same way as that in Example 13 except that the hole transport layer 4 was formed using, instead of the high-molecular-weight compound I, the coating liquid of the high-molecular-weight compound III. Various properties of this organic EL device were evaluated in the same way as that in Example 13, and the results were shown in Table 3.

Comparative Example 9

An organic EL device was prepared in exactly the same way as that in Example 13 except that the hole transport layer 4 was formed using, instead of the high-molecular-weight compound I, a coating liquid prepared by dissolving 0.6 weight % of HTM-1 in toluene. Various properties of this organic EL device were evaluated in the same way as that in Example 13, and the results were shown in Table 3.

Comparative Example 10

An organic EL device was prepared in exactly the same way as that in Example 13 except that the hole transport layer 4 was formed using, instead of the high-molecular-weight compound I, a coating liquid prepared by dissolving 0.6 weight % of TFB in toluene. Various properties of this organic EL device were evaluated in the same way as that in Example 13, and the results were shown in Table 3.

Note that in evaluation of the various properties, the device lifetime was measured as the time until the light-emission luminance was attenuated to 560 cd/m$^2$ (corresponding to 80% when the initial luminance was 100%: 80% attenuation) when constant current driving was performed with the light-emission luminance (initial luminance) at the start of light emission as 700 cd/m$^2$.

TABLE 3

| | Hole transport layer | Voltage[V] (@ 10 mA/cm$^2$) | Luminance [cd/m$^2$] (@ 10 mA/cm$^2$) | Light emission efficiency [cd/A] (@ 10 mA/cm$^2$) | Power efficiency [lm/W] (@ 10 mA/cm$^2$) | Device lifetime 80% attenuation (@ 700 cd/m$^2$) |
|---|---|---|---|---|---|---|
| Example 13 | High molecular weight compound I | 3.83 | 691 | 6.91 | 5.67 | 258 hours |
| Example 14 | High molecular weight compound II | 3.95 | 769 | 7.69 | 6.12 | 557 hours |
| Example 15 | High molecular weight compound III | 3.94 | 712 | 7.12 | 5.68 | 579 hours |
| Comparative Example 9 | HTW-1 | 3.89 | 757 | 7.56 | 6.12 | 19 hours |
| Comparative Example 10 | TFB | 4.11 | 534 | 5.34 | 4.08 | 6 hours |

As shown in Table 3, the drive voltage when a current having the current density of 10 mA/cm² is caused to flow was low, i.e., 3.83 V, 3.95 V, and 3.94 V in the organic EL devices according to Example 13, Example 14, and Example 15 as compared with 4.11 V of the organic EL device according to Comparative Example 10. Further, the light emission efficiency when a current having the current density of 10 mA/cm² was caused to flow was high, i.e., 6.91 cd/A, 7.69 cd/A, and 7.12 cd/A in the organic EL devices according to Example 13, Example 14, and Example 15 as compared with 5.34 cd/A of the organic EL device according to Comparative Example 10. Further, regarding the device lifetime (80% attenuation), the organic EL devices according to Example 13, Example 14, and Example 15 had long lifetimes, i.e., 258 hours, 557 hours, and 579 hours as compared with 19 hours and 6 hours of the organic EL devices according to Comparative Example 9 and Comparative Example 10.

As described above, it was found that the organic EL device that includes an organic layer formed using the high-molecular-weight compound according to the present invention could achieve a low voltage and long lifetime as compared with the existing organic EL device.

INDUSTRIAL APPLICABILITY

The high-molecular-weight compound according to the present invention has high hole transport capacity, excellent electron blocking capability, and favorable heat resistance, and thus is excellent as a compound for a light-emitting diode, particularly as a compound for a coating type organic EL device. By preparing a coating type organic EL device using the compound, it is possible to achieve high light emission efficiency and power efficiency, and improve the durability. For example, it has become possible to develop applications for home appliances and lighting.

The invention claimed is:
1. A high-molecular-weight compound containing
at least one substituted triarylamine structural unit represented by the following general formula (1); and
at least one of a structural unit having an aromatic hydrocarbon ring, represented by one of the following general formulae (2a) to (2x) and a substituted triarylamine structural unit represented by the following general formula (3), and having a weight average molecular weight of 10,000 or more and 1,000,000 or less in terms of polystyrene,

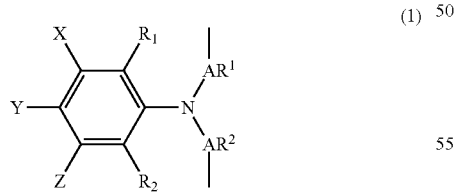
(1)

in the formula (1), $AR^1$ and $AR^2$ each represent a divalent aryl group or a divalent heteroaryl group,
$R_1$ and $R_2$ each represent a hydrogen atom, a deuterium atom, a fluorine atom, a chlorine atom, a cyano group, a nitro group, an alkyl group having 1 to 8 carbon atoms, a cycloalkyl group having 5 to 10 carbon atoms, an alkenyl group having 2 to 6 carbon atoms, an alkyloxy group having 1 to 6 carbon atoms, or a cycloalkyloxy group having 5 to 10 carbon atoms, and X, Y, and Z each represent an aryl group, a heteroaryl group, or a group represented by the $R_1$ and $R_2$ under a condition that at least one of X, Y, and Z represents an aryl group or a heteroaryl group,

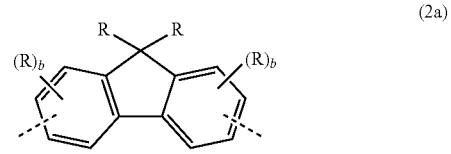
(2a)

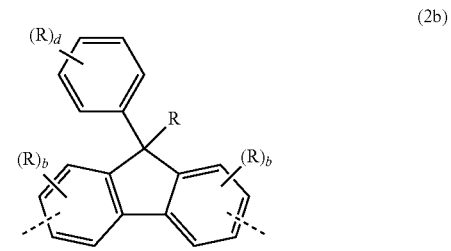
(2b)

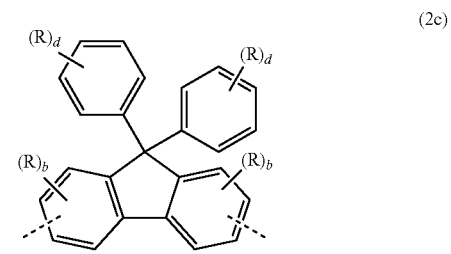
(2c)

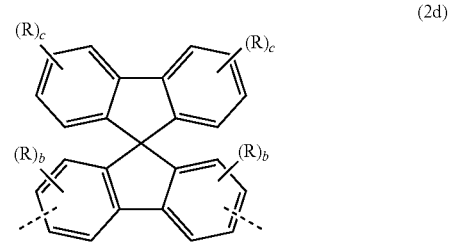
(2d)

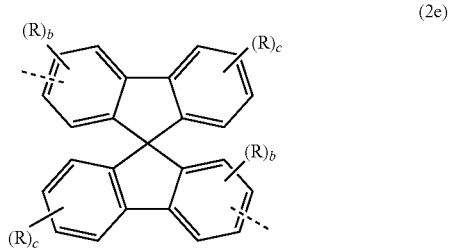
(2e)

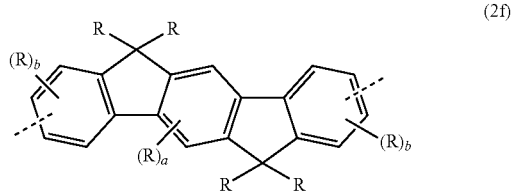
(2f)

-continued
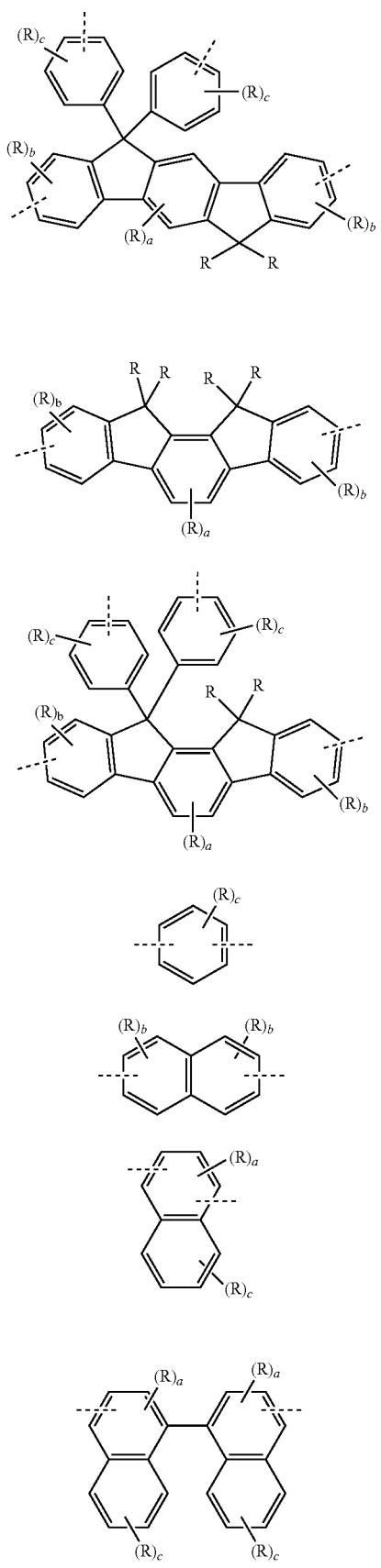
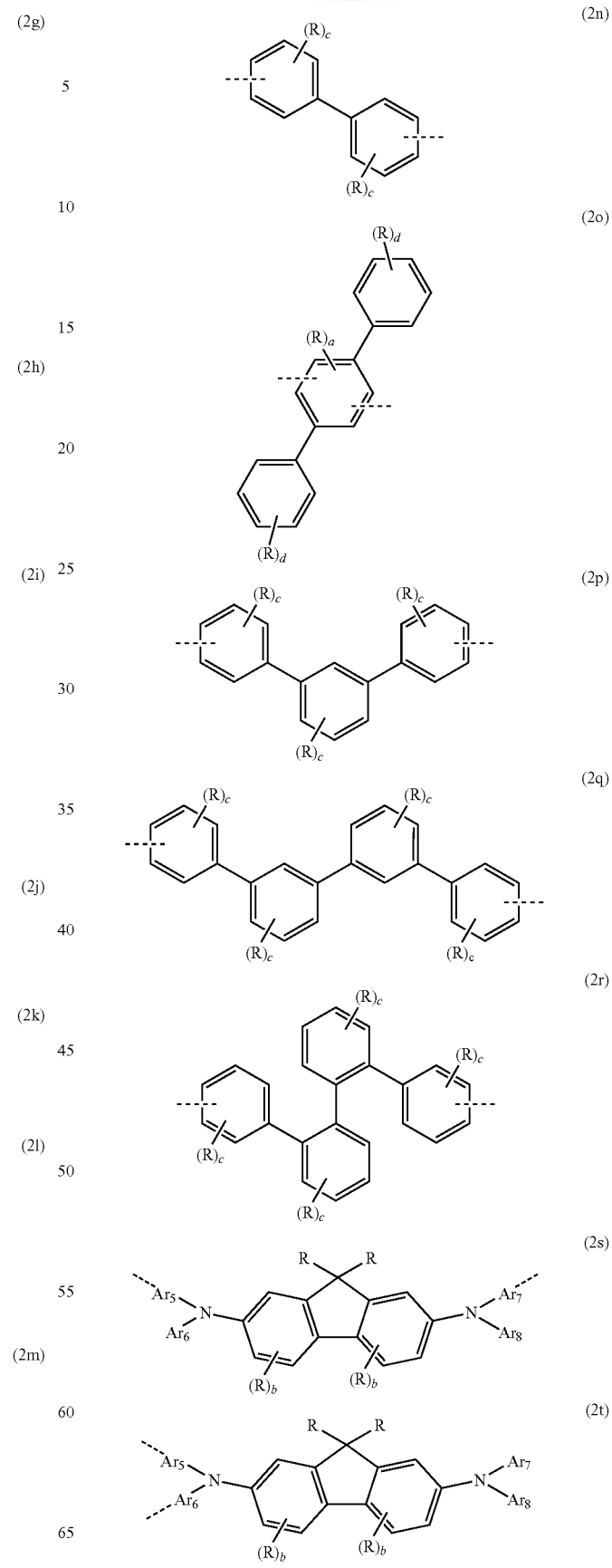

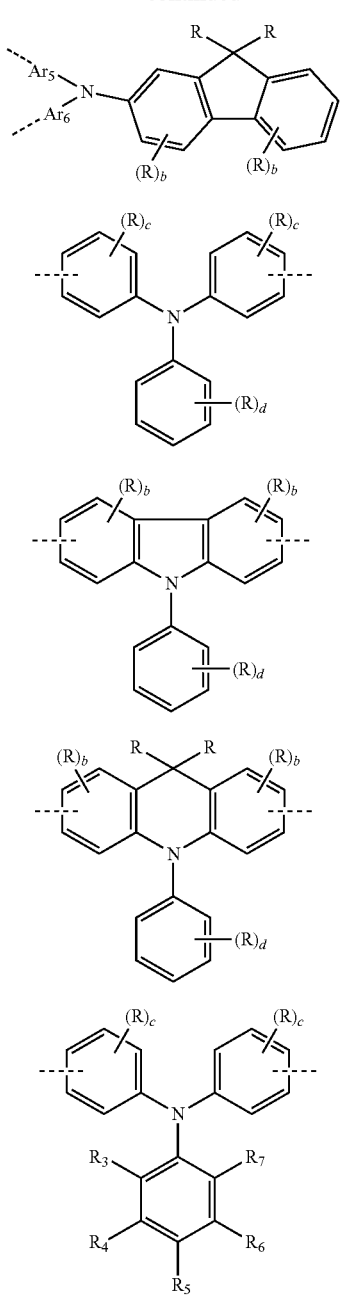

in the formulae (2a) to (2x) and (3),

R represents a hydrogen atom, a deuterium atom, a cyano group, a nitro group, a fluorine atom, a chlorine atom, a bromine atom, an iodine atom, an alkyl group, a cycloalkyl group, an alkoxy group, or a thioalkoxy group that respectively have 40 carbon atoms or less (particularly 3 to 40), R does not bonded to each other to form a ring, $Ar_5$ to $Ar_8$ are the same as or different from each other, and each represent a monovalent or divalent aryl group or heteroaryl group, $R_3$ to $R_7$ are the same as or different from each other, and each represent a hydrogen atom, a deuterium atom, a fluorine atom, a chlorine atom, a cyano group, a nitro group, an alkyl group having 1 to 8 carbon atoms, or an alkyloxy group, $R_3$ to $R_7$ do not bonded to each other to form a ring and a to d each represent the number of Rs and the following numbers:
a=0, 1, or 2
b=0, 1, 2, or 3
c=0, 1, 2, 3, or 4
d=0, 1, 2, 3, 4, or 5.

2. The high-molecular-weight compound according to claim 1, wherein
in the general formula (1), X and Y each represent a substituted or unsubstituted aryl group or heteroaryl group.

3. The high-molecular-weight compound according to claim 2, wherein
in the general formula (1), X and Y represented a group selected from the group consisting of a phenyl group, a biphenylyl group, a terphenyl group, a naphthyl group, a phenanthrenyl group, a fluorenyl group, a naphthylphenyl group, a triphenylenyl group, a dibenzofuranyl group, and a dibenzothienyl group.

4. The high-molecular-weight compound according to claim 3, wherein
also in the general formula (1), $R_1$, $R_2$, and Z each represent a hydrogen atom or a deuterium atom.

5. The high-molecular-weight compound according to claim 1, wherein
in the general formula (1), X and Z each represent a substituted or unsubstituted aryl group or heteroaryl group.

6. The high-molecular-weight compound according to claim 5, wherein
also in the general formula (1), X and Z each represent a group selected from the group consisting of a phenyl group, a biphenylyl group, a terphenyl group, a naphthyl group, a phenanthrenyl group, a fluorenyl group, a naphthylphenyl group, a triphenylenyl group, a dibenzofuranyl group, and a dibenzothienyl group.

7. The high-molecular-weight compound according to claim 6, wherein
also in the general formula (1), $R_1$, $R_2$, and Y each represent a hydrogen atom or a deuterium atom.

8. The high-molecular-weight compound according to claim 1, wherein
in the general formula (1), all of X, Y, and Z each represent a substituted or unsubstituted aryl group or heteroaryl group.

9. The high-molecular-weight compound according to claim 8, wherein
in the general formula (1), all of X, Y, and Z each represent a group selected from the group consisting of a phenyl group, a biphenylyl group, a terphenyl group, a naphthyl group, a phenanthrenyl group, a fluorenyl group, a triphenylenyl group, a dibenzofuranyl group, and a dibenzothienyl group.

10. The high-molecular-weight compound according to claim 9, wherein
in the general formula (1), $R_1$ and $R_2$ each represent a hydrogen atom or a deuterium atom.

11. The high-molecular-weight compound according to claim 1, wherein
in the general formula (1), Y represents a substituted or unsubstituted aryl group or heteroaryl group.

12. The high-molecular-weight compound according to claim 11, wherein in the general formula (1), Y represents a group selected from the group consisting of a phenyl group, a biphenylyl group, a terphenyl group, a naphthyl group, a phenanthrenyl group, a fluorenyl group, a naphthylphenyl group, a triphenylenyl group, a dibenzofuranyl group, and a dibenzothienyl group.

13. The high-molecular-weight compound according to claim 12, wherein
in the general formula (1), $R_1$, $R_2$, X, and Z each represent a hydrogen atom or a deuterium atom.

14. The high-molecular-weight compound according to claim 1, wherein
in the general formula (1), X represents a substituted or unsubstituted aryl group or heteroaryl group.

15. The high-molecular-weight compound according to claim 14, wherein
in the general formula (1), X represents a group selected from the group consisting of a phenyl group, a biphenylyl group, a terphenyl group, a naphthyl group, a phenanthrenyl group, a fluorenyl group, a naphthylphenyl group, a triphenylenyl group, a dibenzofuranyl group, and a dibenzothienyl group.

16. The high-molecular-weight compound according to claim 15, wherein
in the general formula (1), $R_1$, $R_2$, Y, and Z each represent a hydrogen atom or a deuterium atom.

17. An organic electroluminescent device including a pair of electrodes and at least one organic layer sandwiched between the electrodes, wherein
the organic layer includes the high-molecular-weight compound according to claim 1.

18. The organic electroluminescent device according to claim 17, wherein the organic layer is a hole transport layer.

19. The organic electroluminescent device according to claim 17, wherein the organic layer is an electron blocking layer.

20. The organic electroluminescent device according to claim 17, wherein the organic layer is a hole injection layer.

21. The organic electroluminescent device according to claim 17, wherein the organic layer is a light-emitting layer.

* * * * *